(12) United States Patent
Wade et al.

(10) Patent No.: US 6,440,495 B1
(45) Date of Patent: Aug. 27, 2002

(54) CHEMICAL VAPOR DEPOSITION OF RUTHENIUM FILMS FOR METAL ELECTRODE APPLICATIONS

(75) Inventors: Christopher P. Wade, Los Gatos; Elaine Pao, Los Altos Hills; Yaxin Wang, Fremont; Jun Zhao, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/632,497

(22) Filed: Aug. 3, 2000

(51) Int. Cl.[7] .............................................. C23C 16/06
(52) U.S. Cl. ........... 427/250; 427/255.31; 427/255.394; 427/255.7; 427/124
(58) Field of Search ............................... 427/255.7, 250, 427/255.31, 99, 124, 126.5, 255.394; 438/240, 253; 204/192.1

(56) References Cited

U.S. PATENT DOCUMENTS

| | | | | |
|---|---|---|---|---|
| 5,372,849 A | * | 12/1994 | McCormick et al. | 427/255.38 |
| 5,834,357 A | * | 11/1998 | Kang | 438/240 |
| 6,002,036 A | | 12/1999 | Kadokura | 556/136 |
| 6,110,531 A | * | 8/2000 | Paz De Araujo et al. | 427/255.25 |
| 2001/0006838 A1 | | 7/2001 | Won et al. | |
| 2001/0023955 A1 | | 9/2001 | Matsui et al. | |

FOREIGN PATENT DOCUMENTS

EP        1130628 A1    5/2001

OTHER PUBLICATIONS

Aoyama, Tomonori et al., "Ruthenium Films Prepared by Liquid Source Chemical Vapor Deposition Using Bis–(ethylcyclopentadienyl)ruthenium," Japanese Journal of Applied Physics, vol. 38, Pt.2, No. 10A, pp. 11334–1136, 1999.*

* cited by examiner

*Primary Examiner*—Bret Chen
(74) *Attorney, Agent, or Firm*—Townsend and Townsend and Crew

(57) ABSTRACT

The present invention provides a method of depositing ruthenium films on a substrate via liquid source chemical vapor deposition wherein the source material is liquid at room temperature and utilizing process conditions such that deposition of the ruthenium films occurs at a temperature in the kinetic-limited temperature regime. Also provided is a method of depositing a thin ruthenium film on a substrate by liquid source chemical vapor deposition using bis-(ethylcyclopentadienyl) ruthenium by vaporizing the bis-(ethylcyclopentadienyl) ruthenium at a vaporization temperature of about 100–300° C. to form a CVD source material gas, providing an oxygen source reactant gas and forming a thin ruthenium film on a substrate in a reaction chamber using the CVD source material gas and the oxygen source reactant gas at a substrate temperature of about 100–500° C.

12 Claims, 24 Drawing Sheets

Ru(EtCp)2 with and without PVD Ru seed layer
Wafer T = 343°C
On PVD TiN
On PVD Ru Seed
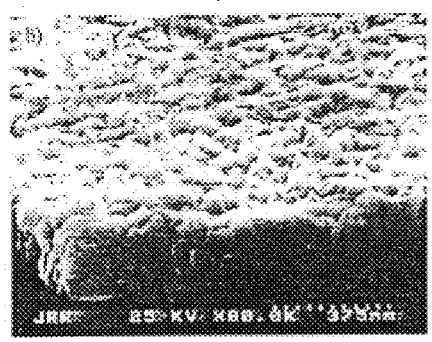
Fig. 13A
Fig. 13B
Ru(Cp)2 vs. Ru(EtCp)2 with PVD Ru seed layer
Mass transfer regime
Wafer T = 343°C
Wafer T = 343°C
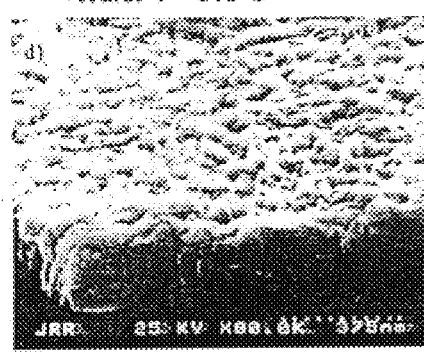
Fig. 13C
Fig. 13D
Ru(Cp)2 vs. Ru(EtCp)2 with PVD Ru seed layer
Kinetic-limited regime
Wafer T = 320°C
Wafer T = 331°C
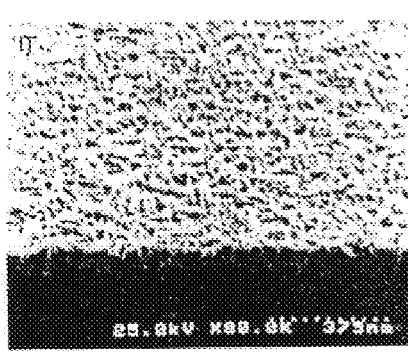
Fig. 13E
Fig. 13F

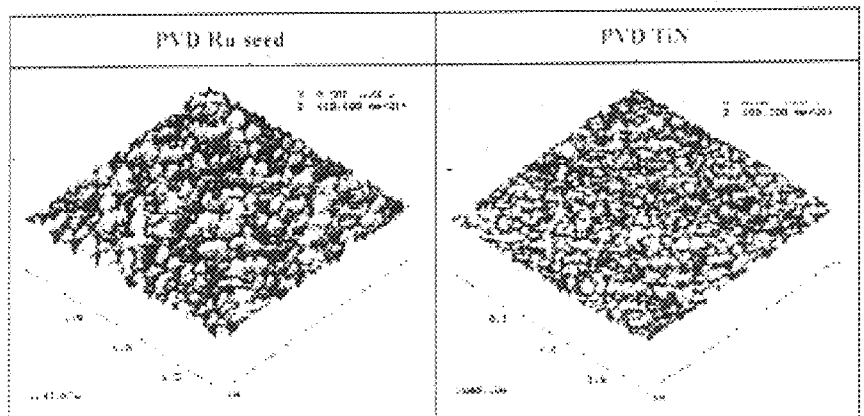
Fig. 14
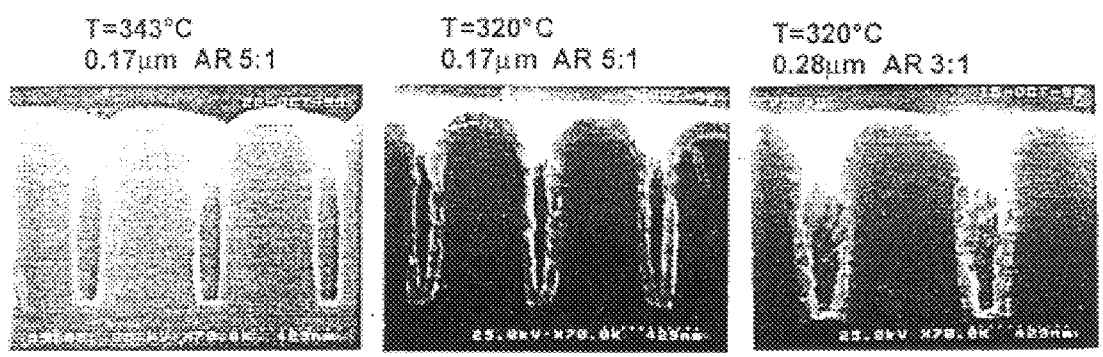
Fig. 15A          Fig. 15B          Fig. 15C
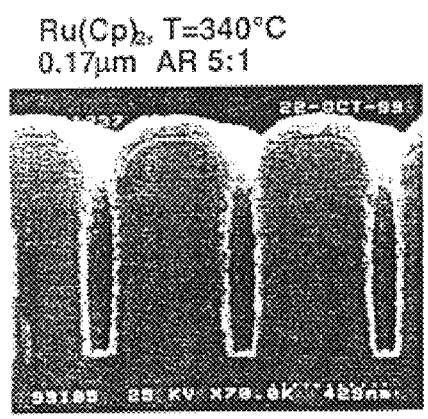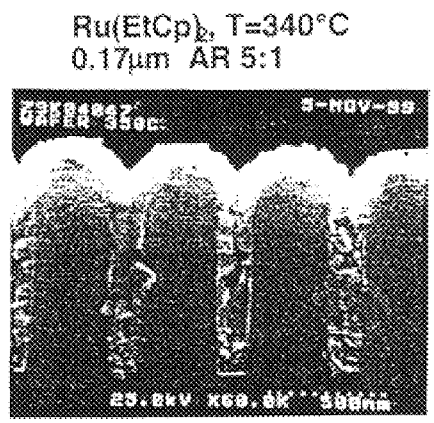
Fig. 16A          Fig. 16B

CHEMICAL VAPOR DEPOSITION OF RUTHENIUM FILMS FOR METAL ELECTRODE APPLICATIONS

BACKGROUND OF THE INVENTION

1. Field of the Invention

The present invention generally relates to the liquid source chemical vapor deposition of metal films as the electrode on capacitors in integrated circuits. More particularly, bis(ethylcyclopentadienyl) ruthenium is used as the liquid source precursor for chemical vapor deposition of ruthenium films at a low temperature in the kinetic-limited temperature regime as the electrode for the application of metal-insulator-metal capacitors.

2. Brief Description of the Related Art

In metal-insulator-metal capacitors, ruthenium is a preferred electrode material for next-generation dynamic random access memories (DRAMs). As the next generation DRAM technology evolves, it will become necessary to use three-dimensional capacitors despite the high-dielectric constant materials employed. The most important characteristics of a capacitor are high dielectric constant and small leakage current even when the electrode film is thin. If the films are being formed for electrodes for DRAM applications, it is advantageous to use a chemical vapor deposition process (CVD).

Chemical vapor deposition is a broad class of processes using controlled chemical reactions to create layers on wafers and is a key process in the development of ultra-large-scale integrated circuit fabrication. Chemical vapor deposition of thin metal films realizes good step coverage and wafer-to-wafer repeatability on complicated topography. However, the source material for CVD processes must be stable and possess good vaporization properties.

The use of liquid source metalorganic precursors for the CVD formation of thin films provides a means of repeatably creating these wafers. CVD precursors for advanced DRAM electrodes and dielectrics have traditionally been solid compounds and although soluble in organic solvents such as tetrahydrofuran, solubility is limited. CVD deposition of films can require high vaporization temperatures and residues are left after vaporization and deposition. Barium strontium titanate thin metal films on a substrate with a BST sputtered film using titanyl bis (dipivaloymethanto) (TIO (DPM)) and titanium tetraisopropoxide (TTIP) organometallic solutions as the CVD liquid source material have been formed.

Traditionally, bis(cyclopentadienyl) ruthenium ($Ru(Cp)_2$) is used to deposit thin ruthenium films on substrates. However, this precursor is a solid at room temperature possessing the concomitant problems of limited solubility in tetrahydrofuran, lower deposition rate and remaining residue after vaporization which could cause particle formation, process drift and prevent precursor transport. Additionally, bis(cyclopentadienyl) ruthenium easily forms a ruthenium oxide film on substrates at low temperatures in the kinetic-limited temperature regime for virtually all process conditions.

It is therefore, advantageous, to use a liquid source for CVD thin film deposition that is a stable liquid at room temperature, yet is less susceptible to oxidation during vaporization and deposition of thin films. Ruthenium films have been deposited on silicon substrates using bis-(ethylcyclopentadienyl) ruthenium. However, these ruthenium films had a large column width and contained large quantities of carbon and hydrogen impurities which resulted in a resistivity greater than that of films deposited using the solid precursor bis-(cyclopentadienyl) ruthenium, although, the resistivity was still sufficiently small to be used as capacitor electrodes.

Bis-(alkyl-cyclopentadienyl) ruthenium complexes, including $Ru(EtCp)_2$, have been synthesized and have been used in a process to produce ruthenium-containing films. These pure ruthenium films were deposited on a silicon substrate at 600° C. in a hydrogen atmosphere. Thus, deposition occurred in the mass-transfer limited regime.

The prior art is deficient in the lack of effective means of depositing pure thin ruthenium films on a substrate using a chemical vapor deposition source that is liquid at room temperature and where deposition temperature occurs in the kinetic-limited temperature range. The present invention fulfills this long-standing need and desire in the art.

SUMMARY OF THE INVENTION

The present invention provides a method of depositing ruthenium films on a substrate via liquid source chemical vapor deposition wherein the source material is liquid at room temperature and utilizes process conditions such that deposition of the ruthenium films occurs at a temperature in the kinetic-limited temperature regime.

In another embodiment of this invention, there is provided a method of depositing a thin ruthenium film on a substrate by liquid source chemical vapor deposition, using bis-(ethylcyclopentadienyl) ruthenium, by vaporizing the bis-(ethylcyclopentadienyl) ruthenium at a vaporization temperature of about 100–300° C. to form a CVD source material gas and forming a thin ruthenium film on a substrate in a reaction chamber using the CVD source material gas and the oxygen source reactant gas such that the substrate has a temperature of about 100–500° C. and deposition of the ruthenium film occurs in the kinetically limited temperature regime.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

Figure 5:
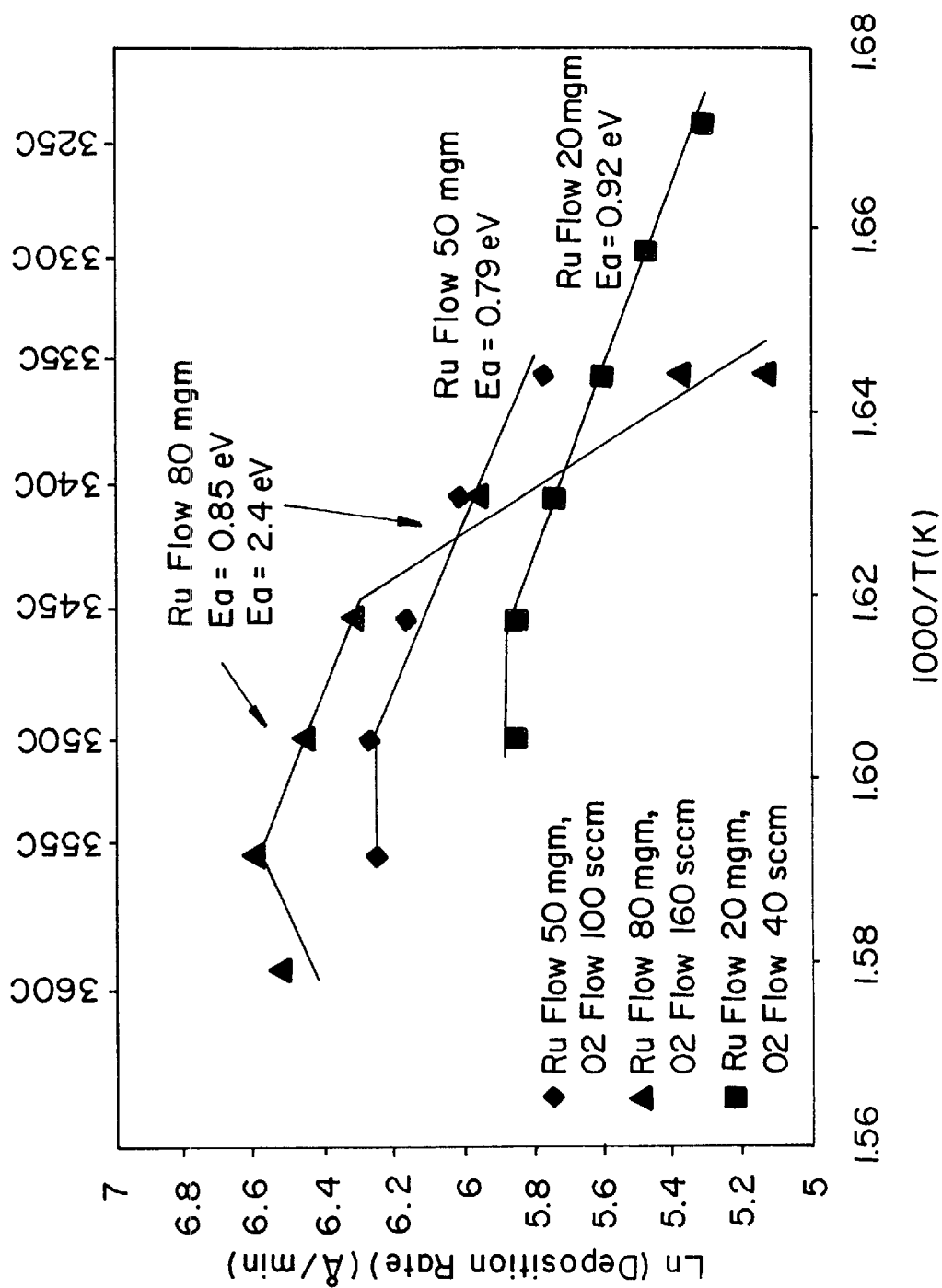

FIG. 5 depicts the Arrhenius plot of CVD Ru process using pure Ru(EtCp)$_2$ at different Ru and O$_2$ flow rates with constant N$_2$ flow rate of 1300 sccm on a 50 Å PVD Ru seed layer/2 kÅ ThOx substrate. The activation energies are also shown. N$_2$ carrier flow is 450 sccm.

Figure 6A:
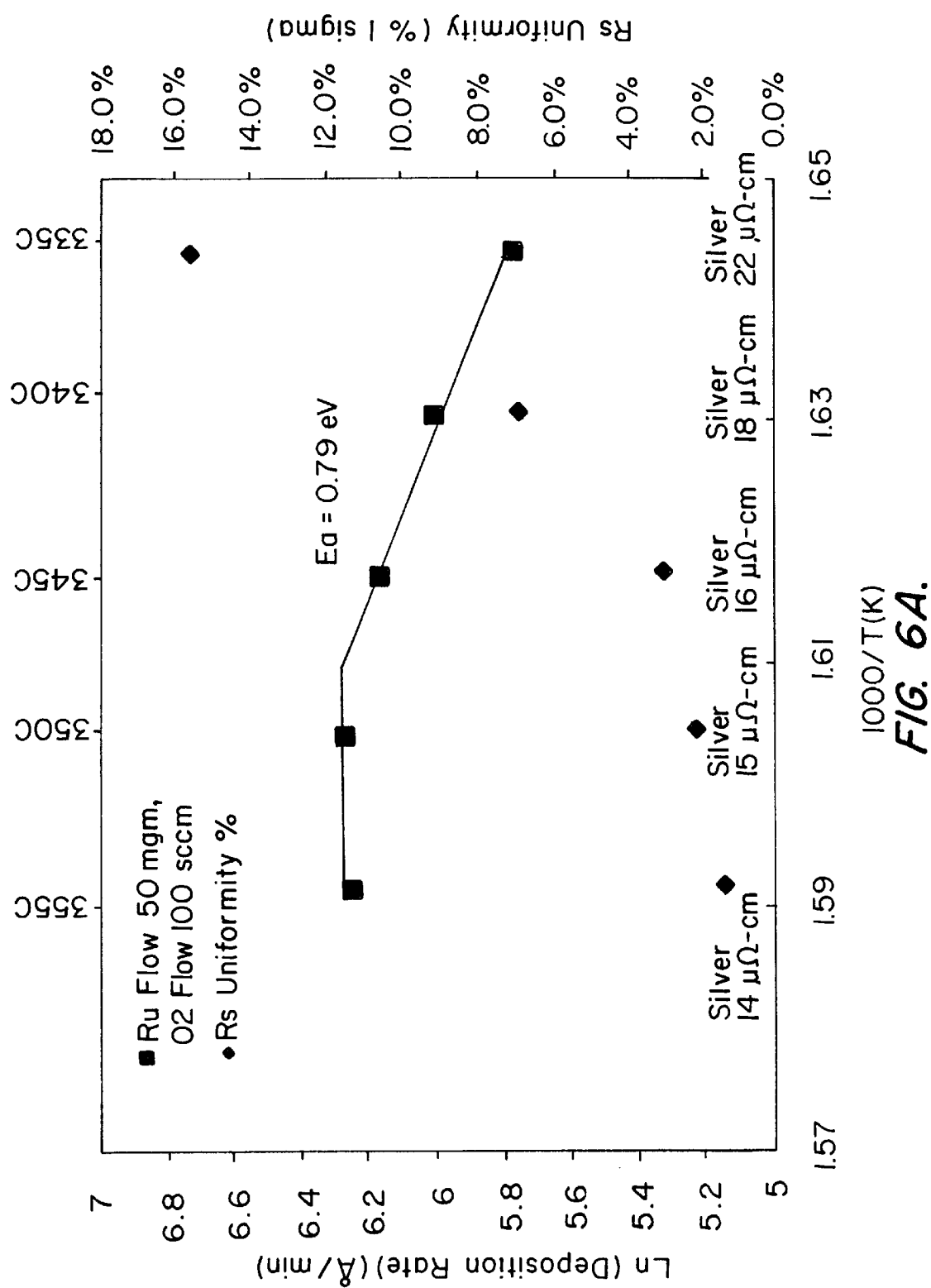
Figure 6B:
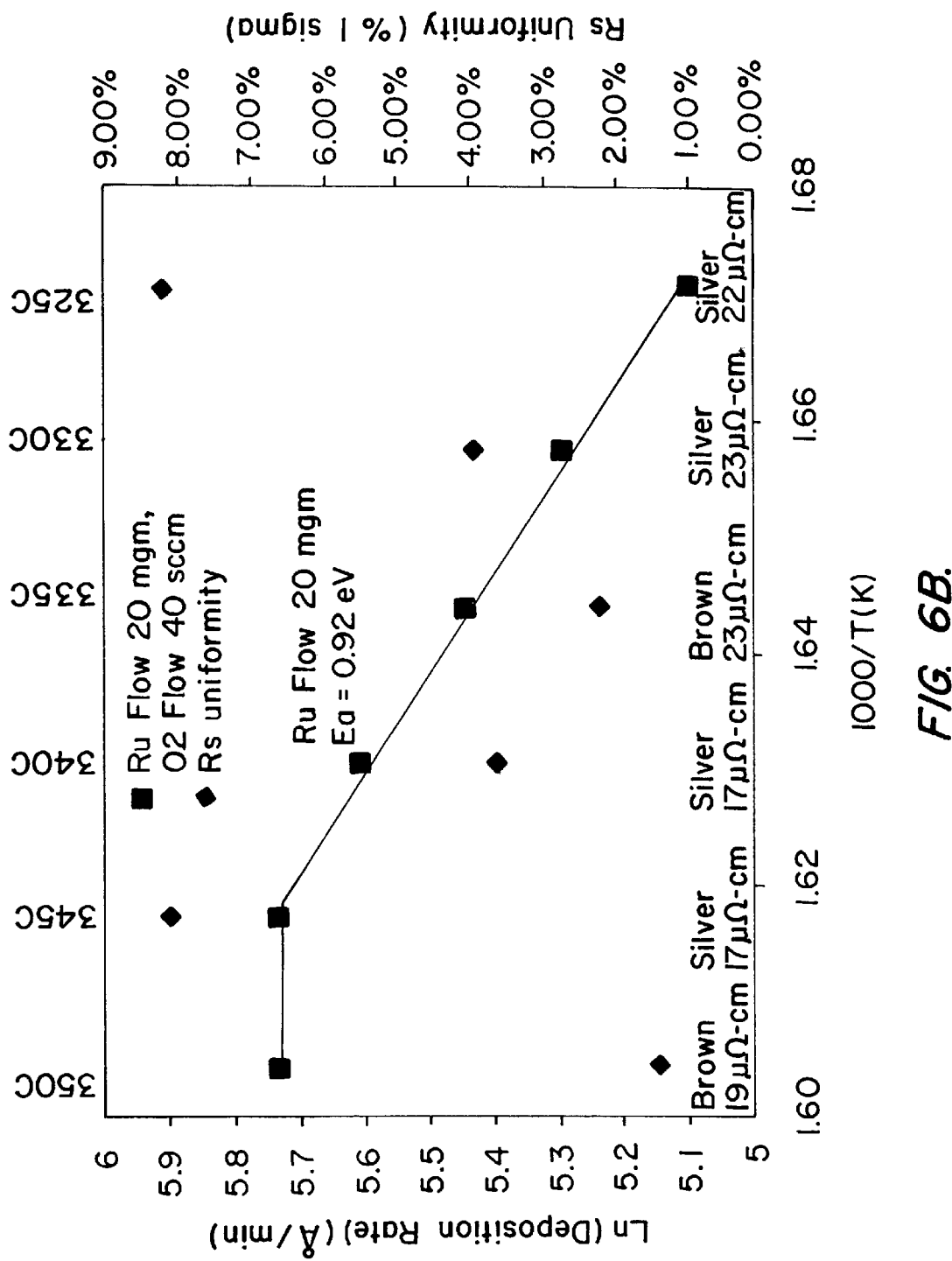

FIG. 6 depicts the Arrhenius plot of CVD Ru process deposition rate and resistance uniformity using pure Ru(EtCp)$_2$ at flow rates of 50 mgm Ru and 100 sccm O$_2$ (FIG. 6A) and rates of 20 mgm Ru and 40 sccm O$_2$ (FIG. 6B) on a 50 Å PVD Ru seed layer/2 kÅ ThOx substrate. N$_2$ flow is 1300 sccm and N$_2$ carrier flow is 450 sccm.

Figure 7:
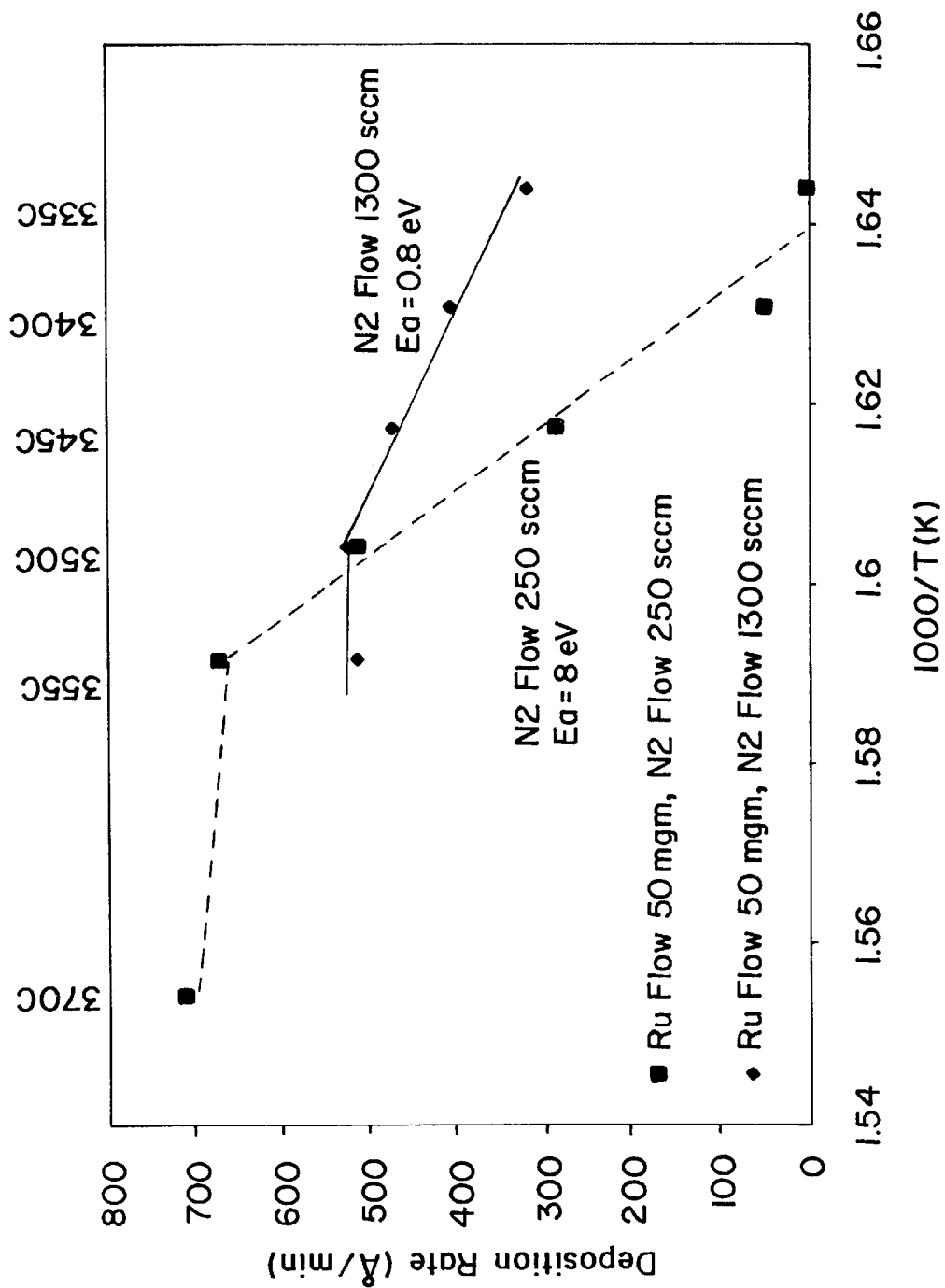

FIG. 7 depicts the Arrhenius plot of CVD Ru process deposition rate using pure Ru(EtCp)$_2$ at N$_2$ flow rates of 250 sccm, and 1300 sccm on a 50 Å PVD Ru seed layer/2 kÅ ThOx substrate. Ru flow is 50 mgm and N$_2$ carrier flow is 450 sccm.

Figure 8:
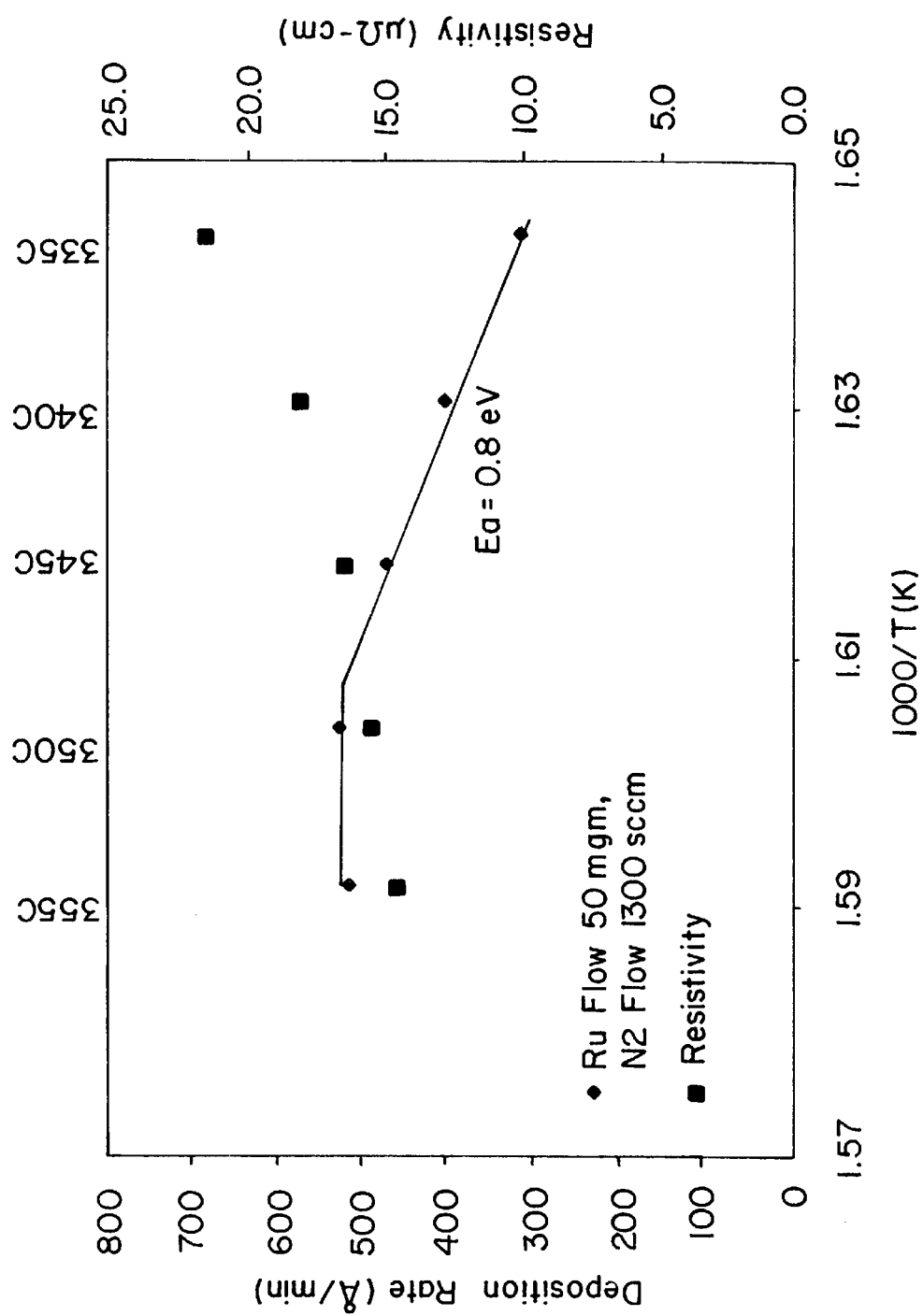

FIG. 8 depicts the Arrhenius plot of CVD Ru process deposition rate and resistivity using pure Ru(EtCp)$_2$ at a high N$_2$ flow rate of 1300 sccm on a 50 Å PVD Ru seed layer/2 kÅ ThOx substrate. Ru flow is 50 mgm, O$_2$ flow rate is 100 sccm and N$_2$ carrier flow is 450 sccm.

FIG. 9 depicts the X-Ray Diffraction (XRD) pattern of chemical vapor deposition Ru film grown with Ru(EtCp)$_2$ in octane with a deposition temperature of 330° C., substrate of 60 Å physical vapor deposition Ru/2000 Å SiO$_2$ and Ru thickness of 600 Å (FIG. 9A) and with a deposition temperature of 320° C., substrate of 60 Å PVD Ru/2000 Å SiO2 and Ru thickness of 280 Å (FIG. 9B) and with Ru(Cp)$_2$ in tetrahydrofuran with a deposition temperature of 340° C., substrate of 60 Å PVD. Ru/200 Å PVD TiN and Ru thickness of 800 Å (FIG. 9C), with a deposition temperature of 320° C., substrate of 60 Å PVD Ru/200 Å PVD TiN and Ru thickness of 650 Å (FIG. 9D) and, in the kinetic-limited regime, with a deposition temperature of 295° C., substrate of 60 Å PVD Ru/200 Å PVD TiN and Ru thickness of 500 Å (FIG. 9E).

Figure 10:
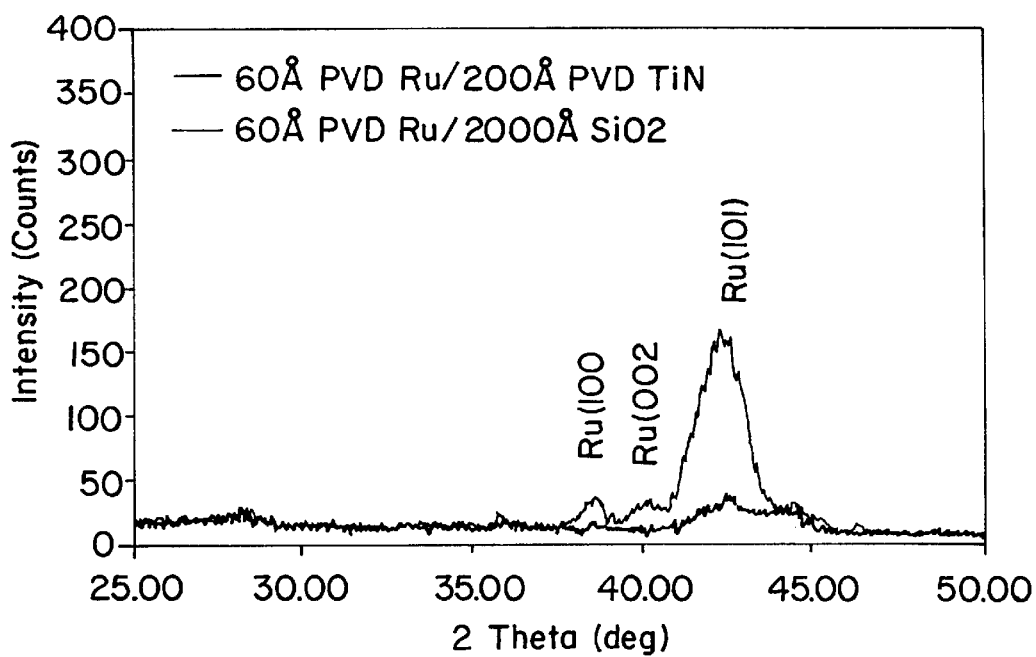

FIG. 10 depicts the X-Ray Diffraction (XRD) pattern of chemical vapor deposition Ru film grown with Ru(EtCp)$_2$ in octane on a PVD Ru seed substrate on 2000 Å thermal oxide and PVD Ru seed substrate on 200 Å PVD TiN.

Figure 11:
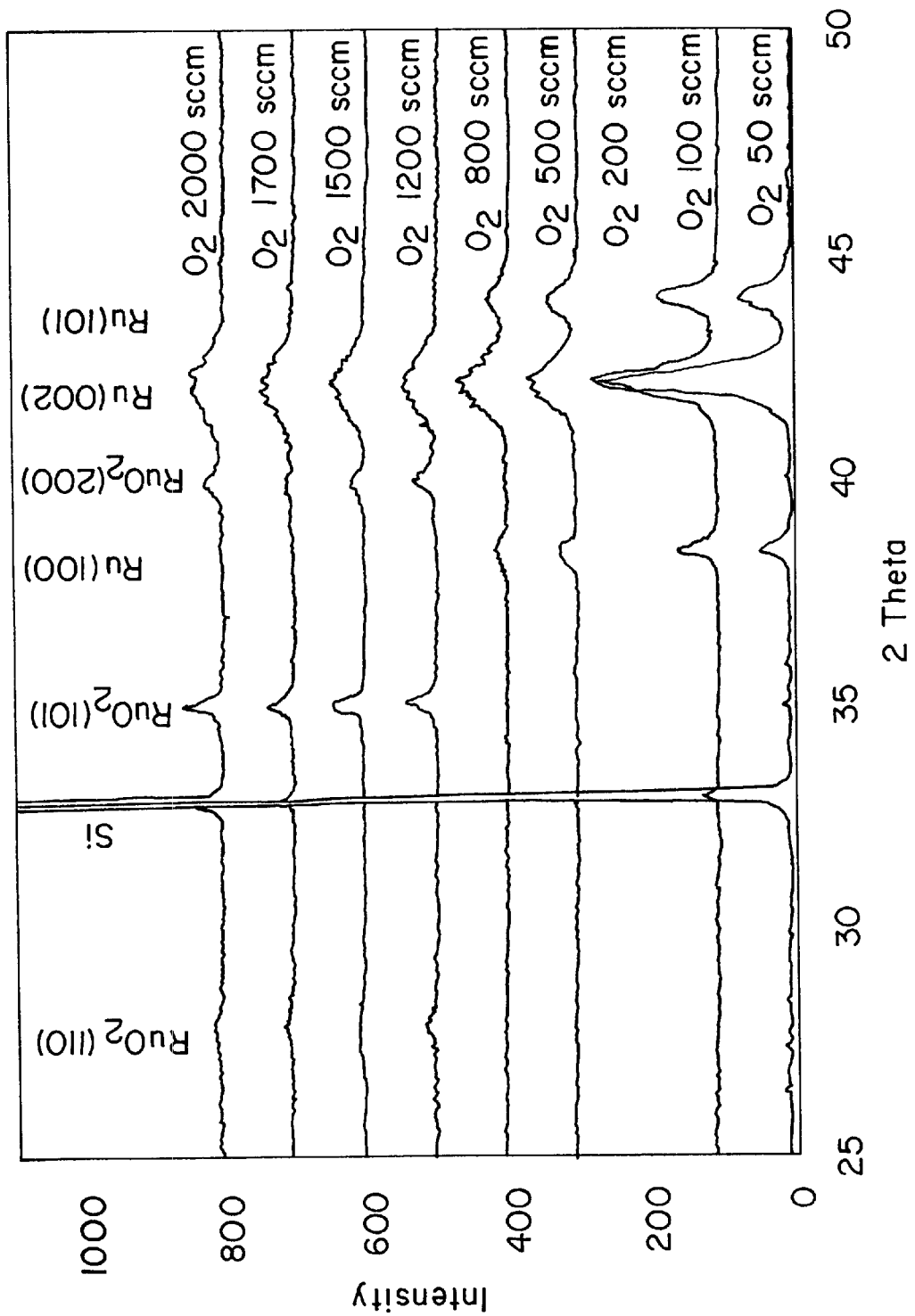

FIG. 11 depicts the effect of O$_2$ flow on CVD Ru orientation, using pure Ru(EtCp)$_2$ on a 50 Å PVD Ru seed layer/2 kÅ ThOx substrate. Temperature is 355° C., N$_2$ flow rate is 250 sccm and N$_2$ carrier flow rate is 450 sccm.

Figure 12:
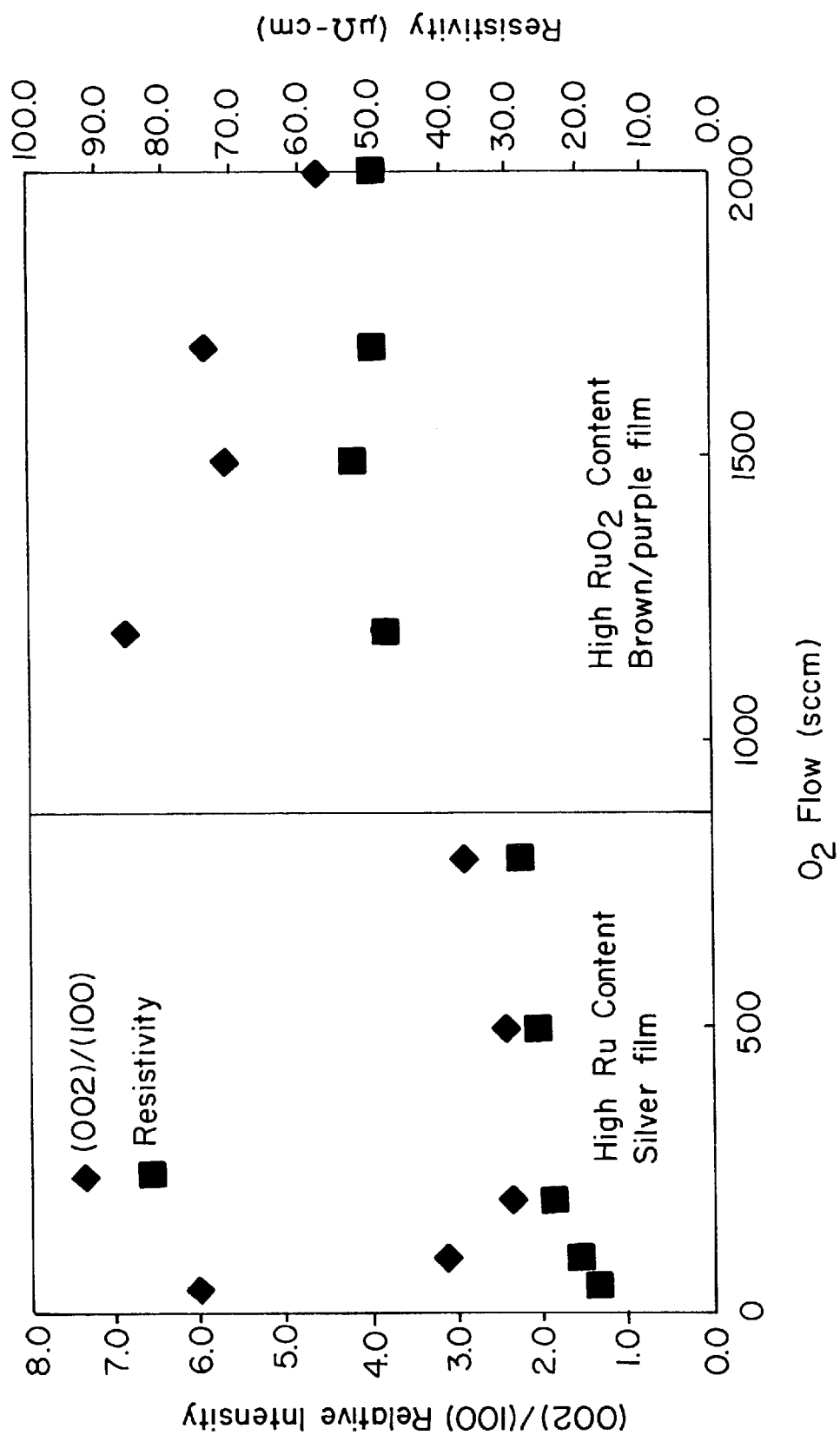

FIG. 12 depicts the effect of O$_2$ flow on CVD Ru (002) orientation and resistivity using pure Ru(EtCp)$_2$ on a 50 Å PVD Ru seed layer/2 kÅ ThOx substrate. Process conditions are: 355° C., N$_2$ 250 sccm, N$_2$ carrier 450 sccm, and 8 torr.

FIG. 13 depicts SEM Images of the CVD Ru films to compare the surface roughness Ru(EtCp)$_2$ precursor at 343° C. on 200 Å PVD TiN (FIG. 13A), Ru(EtCp)$_2$ precursor at 343° C. on PVD Ru seed/2000 Å Oxide (FIG. 13B), Ru(Cp)$_2$ precursor at 343° C. on PVD Ru seed/200 Å PVD TiN (FIG. 13C), Ru(EtCp)$_2$ precursor at 343° C. on PVD Ru seed/2000 Å Oxide (FIG. 13D), Ru(CP)$_2$ precursor at 320° C. on PVD Ru seed/200 Å PVD TiN (FIG. 13E), Ru(EtCp)$_2$ precursor at 330° C. on PVD Ru seed/ 2000 Å Oxide (FIG. 13F).

FIG. 14 depicts an AFM 2 μm×2 μm scan of CVD Ru film deposited using Ru(Cp)$_2$ at 343° C. on PVD Ru seed/200 Å PVD TiN and PVD TiN.

FIG. 15 depicts the comparison of step coverage using Ru(Cp)$_2$ precursor at two different temperatures on 200 Å PVD TiN layer. FIG. 15A: Bottom/Top Ratio ~30%, Sidewall/Top Ratio ~40%, Conformality ~60%. FIG. 15B: Bottom/Top Ratio ~90%, Sidewall/Top Ratio ~90%, Conformality ~80%. FIG. 15C reveals a roughness problem at larger geometry.

FIG. 16 depicts the comparison of step coverage using Ru(Cp)$_2$ (FIG. 16A) and Ru(EtCp)$_2$ in octane (FIG. 16B) on 200 Å PVD TiN seed layers at 340° C. with 0.17 μm AR 5:1. FIG. 16A: Bottom/Top Ratio ~35%, Sidewall/Top Ratio ~30%, Conformality ~60%.

Figure 17A:
Figure 17B:
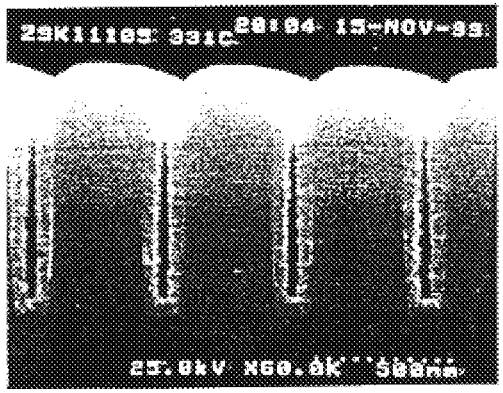

FIG. 17 depicts the comparison of step coverage using Ru(EtCp)$_2$ in octane precursor with and without 60 Å Ru seed layer. FIG. 17A: Bottom/Top Ratio ~30%, Sidewall/Top Ratio ~30%, Conformality ~50%. FIG. 17B: Bottom/Top Ratio 90%, Sidewall/Top Ratio ~90%, Conformality ~80%. Deposition temperatures were changed slightly due to CVD Ru process substrate sensitivity.

Figure 18A:
Figure 18B:

FIG. 18 depicts the comparison of step coverage using Ru(Cp)$_2$ and Ru(EtCp)$_2$ in octane on 60 Å PVD Ru seed layer. FIG. 18A: Bottom/Top Ratio ~40%, Sidewall/Top Ratio ~50%, Conformality ~80%. FIG. 18B: Bottom/Top Ratio 90%, Sidewall/Top Ratio ~90%, Conformality ~80%.

Figure 19:
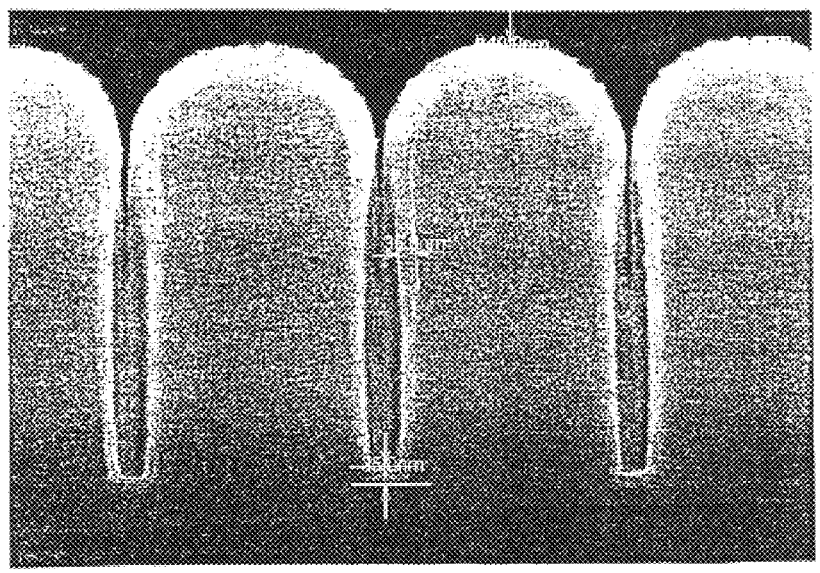
Figure 20A:
Figure 20A:
Figure 20B:
Figure 20B:

FIG. 19 depicts the step coverage of a chemical vapor deposition Ru film using pure Ru(EtCp)$_2$ at 355° C. for a 0.15 um trench, AR 6:1. Topfilm thickness 400 Å, side film thickness ~350 Å, bottom film thickness ~350 Å, sidewall coverage ~88%, bottom coverage ~88%.

FIG. 20 depicts a demonstration of top electrode application: CVD Ru deposited at 340° C. with Ru(EtCp)$_2$ in octane precursor on 80 Å Ta$_2$O$_5$/1500 Å poly-Si substrate. CVD Ru film thickness ~1500 Å. FIG. 20A: 0.1 um AR 16:1, Bottom/Top Ratio ~10%, Sidewall/Top Ratio ~10%, Conformality ~40%. FIG. 20B: 0.05 um AR 20:1, Bottom/Top Ratio N/A, Sidewall/Top Ratio ~5%, Conformality ~25%.

Figure 21A:
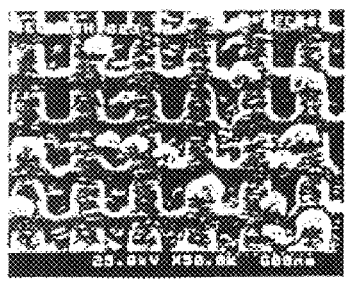
Figure 21B:
Figure 21C:

FIG. 21 depicts SEM Images of CVD Ru films deposited on CVD BST/PVD Pt on, patterned cup structures.

Figure 22A:
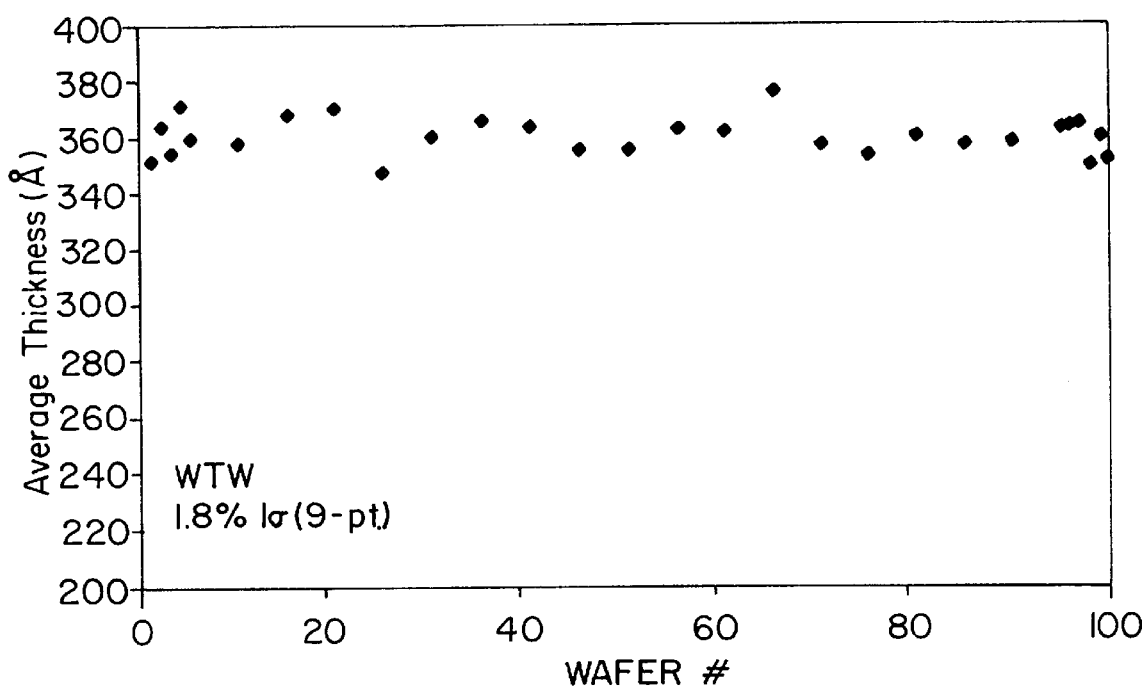
Figure 22B:
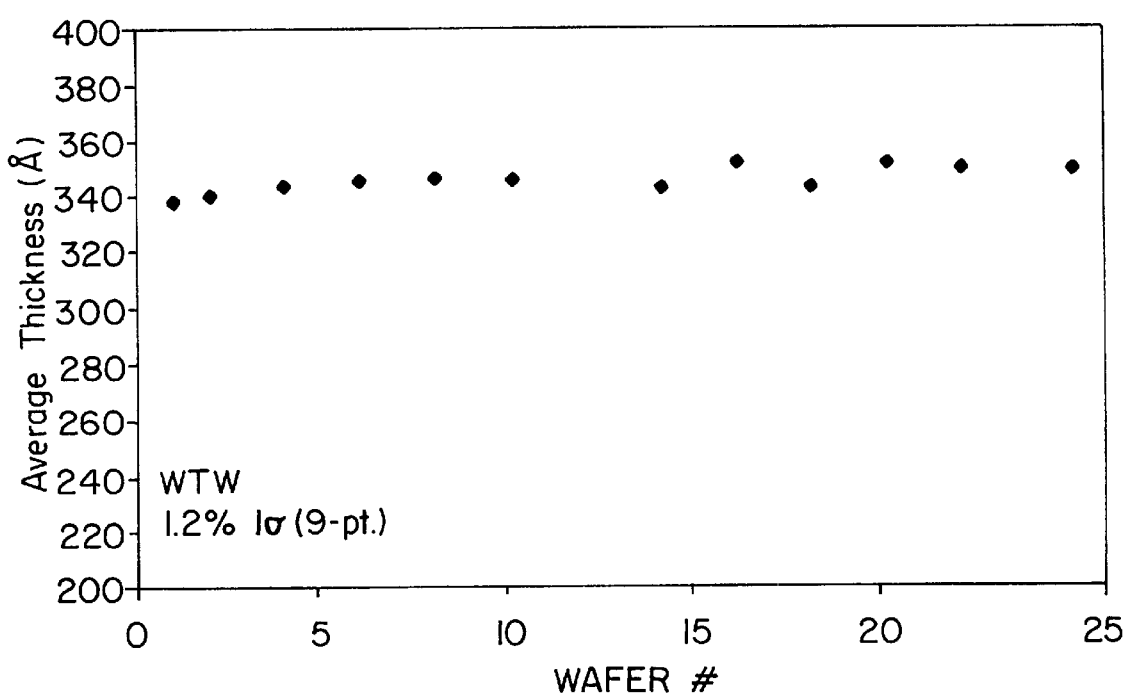

FIG. 22 depicts process repeatability for Ru(Cp)$_2$ and Ru(EtCp)$_2$ in octane precursors. FIG. 22A: Repeatability plot for 100-wafer run using Ru(Cp)$_2$ precursor. The wafer temperature was 340° C., and the substrate was 200 Å PVD TiN/Si. FIG. 22B: Repeatability plot for 25-wafer run using Ru(EtCp)$_2$ precursor. The wafer temperature was 330° C., and the substrate was 60 Å PVD Ru/2000 Å thermal SiO$_2$.

FIG. 23 depicts the effects of using a clamp ring for edge exclusion during CVD Ru deposition. FIG. 23A shows the positioning of the clamp ring; FIG. 23B is a thickness profile by alpha step of the CVD Ru film; FIG. 23C shows the SEM of the cross section of the wafer edge where the clamp ring is positioned; and FIG. 23D shows the presence of particles at the wafer's edge under the clamp ring.

Figure 24:
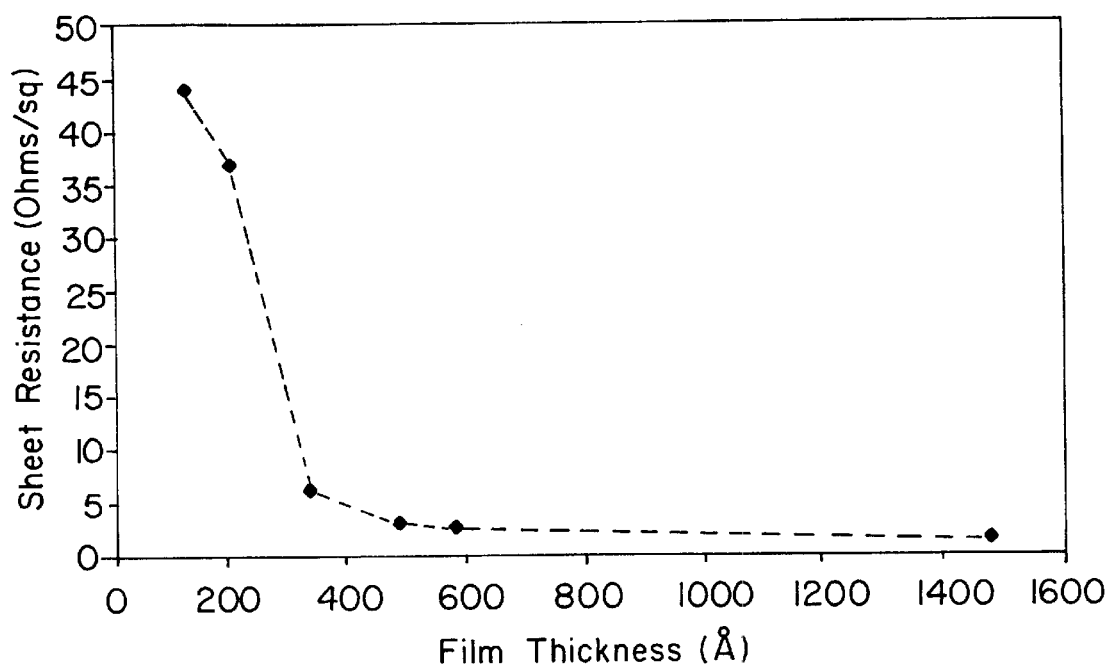

FIG. 24 depicts the dependence of sheet resistance on film thickness.

DETAILED DESCRIPTION OF THE INVENTION

In one embodiment, the present invention provides a method of depositing ruthenium films on a substrate via liquid source chemical vapor deposition wherein the source material is liquid at room temperature and utilizes process conditions such that deposition of the ruthenium films occurs at a temperature in the kinetic-limited temperature regime. A representative example of the liquid source is bis-(ethylcyclopentadienyl) ruthenium. Representative examples of the substrate are thermal oxide, titanium nitride, titanium aluminum nitride, tantalum pentoxide, tantalum nitride, tantalum, barium strontium titanate, strontium oxide, ruthenium oxide, silicon nitride, tungsten nitride, lead zirconium titanate (PZT), strontium bismuth tantalate (SBT), and silicon dioxide. Additionally, the substrate wafers have a first film or seed layer deposited via vapor deposition, for example, physical vapor deposition or chemical vapor deposition. Representative examples of the seed layer are ruthenium, iridium, platinum, titanium nitride, titanium aluminum nitride, tantalum pentoxide, ruthenium oxide and titanium silicide. Also provided are process conditions comprising a ruthenium vaporization temperature of about 100–300° C. and a substrate temperature of about 100–500° C.

Another embodiment of the present invention provides a method of depositing a thin ruthenium film on a substrate by liquid source chemical vapor deposition, using bis-(ethylcyclopentadienyl) ruthenium as the liquid source. This method comprises vaporizing the bis-(ethylcyclopentadienyl) ruthenium at a vaporization temperature of about 100–300° C. to form a chemical vapor deposition source material gas, providing an oxygen source reactant gas and forming a thin ruthenium film on a substrate in a reaction chamber using the CVD source material gas and the oxygen source reactant gas such that the substrate has a temperature of about 100–500° C. and deposition of the ruthenium film occurs in the kinetically limited temperature regime. Representative examples of the substrate are thermal oxide, titanium nitride, titanium aluminum nitride, tantalum pentoxide, tantalum nitride, tantalum, barium strontium titanate, strontium oxide, ruthenium oxide, silicon nitride, tungsten nitride, lead zirconium titanate, strontium bismuth tantalate, and silicon dioxide. Additionally, the substrate wafers have a first film or seed layer deposited via vapor deposition, for example, physical vapor deposition or chemical vapor deposition. Representative examples of the seed layer are ruthenium, iridium, platinum, titanium nitride, titanium aluminum nitride, tantalum pentoxide, ruthenium oxide and titanium silicide.

The following definitions are given for the purpose of understanding the present invention. Any terms not expressly defined herein should be given their clear and ordinary meaning in the art.

As used herein the term, "seed layer" shall refer to a layer of material used to facilitate the growth of another layer in order to have desired properties; e.g., high nucleation density, low roughness and specific orientation.

As used herein the term, "kinetically-limited temperature regime" shall refer to the range of deposition temperatures over which the deposition rate of a chemical vapor deposition film is limited by the kinetics of the chemical reactions at the substrate surface, typically characterized by a strong dependence of deposition rate on temperature.

As used herein the term, "mass-transfer limited regime" shall refer to the range of deposition temperatures over which the deposition rate of a CVD film is limited by the flux of chemical reactants to the substrate surface, characterized by a strong dependence of deposition rate on chemical flow rates and independent of deposition temperature.

Process conditions for CVD deposition of ruthenium films are selected so that the ruthenium films are formed at lower temperatures in the-kinetically limited temperature regime thus yielding pure ruthenium films possessing low oxygen content and low resistivity. Optionally, the substrate has a seed layer which controls the CVD ruthenium film roughness, improves the adhesion to the substrate and improves the step coverage and conformality on patterned structures.

In determining the optimum deposition conditions, the CVD ruthenium films are deposited using a range of process conditions for all precursors. The following film properties are compared: crystalline orientation, thickness WIW uniformity, resistivity, Rs WIW uniformity, surface roughness, step coverage, and conformality on patterned structures. X-ray diffraction (XRD) analysis of crystalline orientation shows that films deposited with the $Ru(Cp)_2$ precursor in the kinetic-limited regime are significantly oxidized to $RuO_2$, while films deposited with $Ru(EtCp)_2$, either pure or 1.0 M in octane, in the same regime still contain significant amounts of pure ruthenium. For thickness within-wafer uniformity, there are metrology issues with the XRF and Metapulse tools, $Ru(EtCp)_2$ in octane and $Ru(CP)_2$ are comparable with regard to resistivity and Rs WIW uniformity. SEM images in conjunction with AFM data show that CVD Ru films have high roughness whether deposited with $Ru(EtCp)_2$ or $Ru(Cp)_2$.

The use of a PVD Ru seed layer, approximately 50–60 Å thick, reduces surface roughness. Step coverage results show that conformal CVD Ru films in aggressive structures can be grown using $Ru(EtCp)_2$ in octane or pure $Ru(EtCp)_2$ or $Ru(Cp)$ precursors. Both $Ru(CP)_2$ and $Ru(EtCp)_2$ precursors demonstrate 90% step coverage (sidewall/top and bottom/top) and 80% conformality (sidewall thickness variation) for a 0.17 μm trench with a 5:1 aspect ratio (AR). Pure $Ru(EtCp)_2$ precursor demonstrates ~88% sidewall coverage and ~88% bottom coverage for a 0.15 μm trench with a 6:1 (AR). From the demonstrable chemical properties, process performance, and film properties, $Ru(EtCp)_2$ is an excellent precursor for CVD Ru process on the basis of high deposition rate, low residue, good step coverage and wafer-to-wafer repeatability, and oxidation resistance in the kinetic-limited temperature regime.

The following examples are given for the purpose of illustrating various embodiments of the invention and are not meant to limit the-present invention in any fashion.

EXAMPLE 1

Materials

Both bis(cyclopentadienyl) ruthenium ($Ru(Cp)_2$) and bis(ethylcyclopentadienyl) ruthenium ($Ru(EtCp)_2$) were manufactured and supplied by Advanced Chemical Delivery Systems (ACDS). These precursors are used to deposit CVD Ru films as the electrode for the application of metal-insulator-metal (MIM) capacitors. In general, the CVD Ru film must have the following characteristics: thickness non-uniformity within wafer less than 2% (1σ, 49 pts/9 pts, 15 mmEE); wafer-to-wafer repeatability less than 2% (1σ); film resistivity ρ less than 25 μΩ-cm; and sheet resistance non-uniformity less than 10% (1s, 49 pts, 5 mmEE); and step coverage and sidewall conformality greater than 90%. The film needs to be reasonably smooth so that the capacitor stack is reliable and the film is continuous at thicknesses of 300 Å and below. Table 1 lists the target specifications together with the current process performance and best results for CVD Ru using $Ru(EtCp)_2$.

TABLE 1

| | CVD Ru Current Results | |
|---|---|---|
| | Target | Current Best Known Method |
| Thickness | 300–1000 Å | 300 Å |
| Deposition Rate | >100 Å/min | >100 Å/min |

TABLE 1-continued

CVD Ru Current Results

|  | Target | Current Best Known Method |
|---|---|---|
| Thickness Uniformity |  |  |
| WIW (9 pts. XRF) | <2%, 1σ | 3–4%, 1σ |
| WTW- | <2%, 1σ | ~2%, 1σ (5 wafers) |
| Resistivity | 25 μΩ-cm | 22 μΩ-cm |
| Rs Uniformity |  |  |
| 48 pts, 3 mm e.e. | <10%, σ | 5%, 1σ |
| Conformality | ≧90% | ≧90% |
| 0.15 μm @ 4:1, 300 Å |  |  |
| Step Coverage | N/A | ~90% |
| Roughness | Measure, TBD no PVD Ru seed | Haze 30–50 ppm >requires PVD seed |
| Adhesion | no delamination | no delamination |
| Particles | <0.2 P/cm²; <0.16 μm | <0.2 P/cm², >0.16 μm*** |
| C Content | TBD |  |
| MIM Capcitor |  |  |
| Toxeq | <10 Å | TBD |
| J | 1E-8A/cm² @ 1 V | TBD |

*Wafer Y0f02603 run at 335° C. wafer temp. not BKM 320° C., no edge exclusion
**25-wafer at Ru 180 mgm/O₂ 300 sccm/8/Toor/N₂ 250 sccm 320° C. wafer/200 Å thickness
***Limited particle test on Si wafer after 650 wafers run through chamber EXAMPLE 2
Physical Properties of $Ru(Cp)_2$ and $Ru(EtCp)_2$ The $Ru(Cp)_2$ precursor is a solid at room temperature and is dissolved in the solvent Tetrahydrofuran (THF) in which the maximum allowable solubility is only 0.12 M. The $Ru(EtCp)_2$ precursor is a liquid at room temperature and is dissolved in octane to 1.0M concentration or used in pure form. Table 2 compares the basic properties of the two precursors.

TABLE 2

Basic Properties of $Ru(Cp)_2$ and $Ru(EtCp)_2$

| Precursor | State @ 25° C. | M.P | TGA Residue (ADCS) | AMAT Vaporizer Temp. | Current Precursor Solution | Comments |
|---|---|---|---|---|---|---|
| Ru(Cp)₂ | Solid | 195° C. | 2.5% (1 atm O₂) | 220° C. | 0.1 M in THF | Low solubility limits dep. Rate |
| Ru(EtCp)₂ | Liquid | 12° C. | No residue 1 atm Ar | 260° C. | 1.0 M in octane or pure |  |

EXAMPLE 3
Thermal Gravimetric Analysis (TGA) and Differential Scanning Calorimetry (DSC)

Figure 1A:
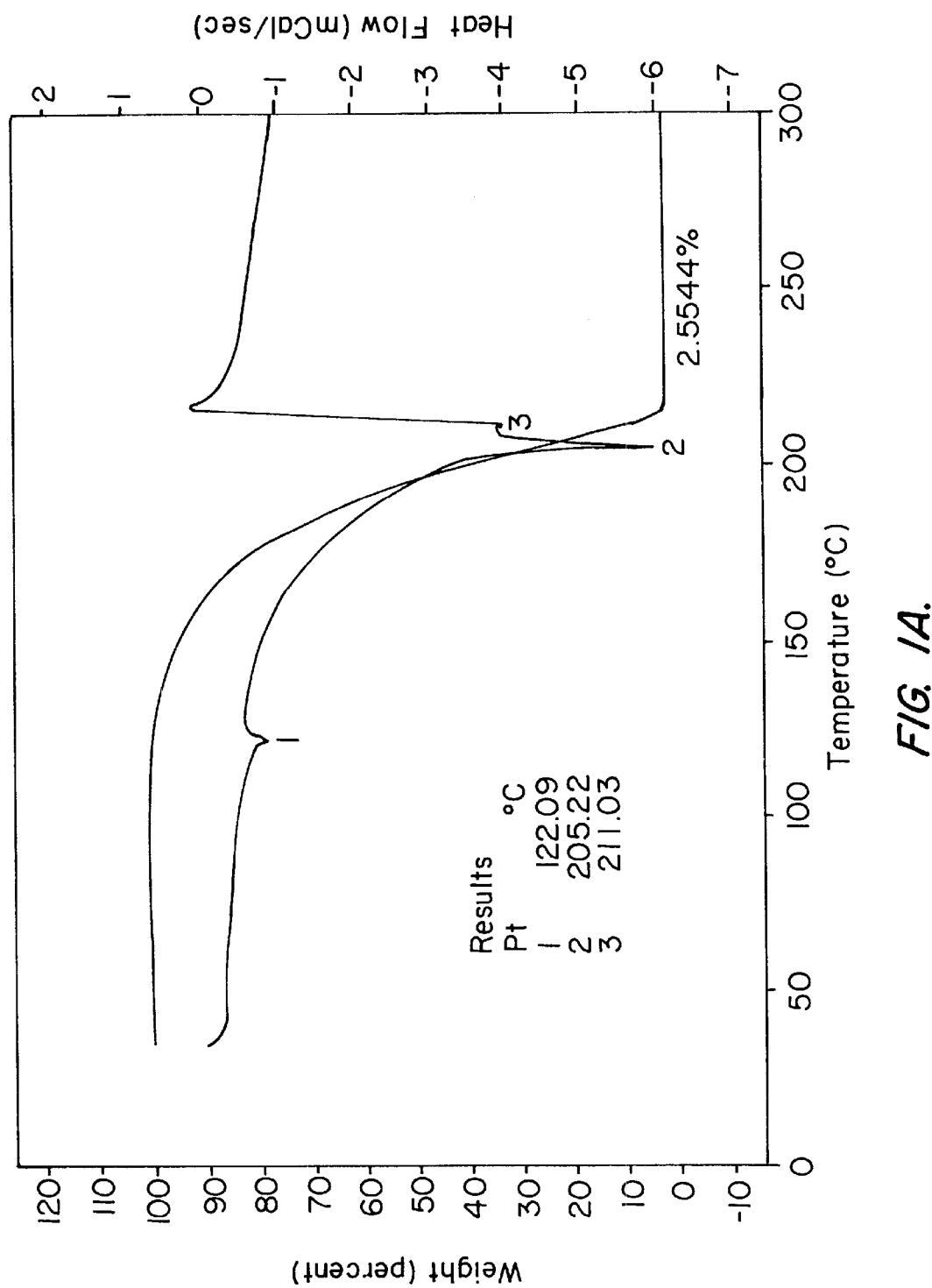
FIG. 1 depicts the Thermal Gravimetric Analysis and Differential Scanning Calorimetry data for the $Ru(Cp)_2$ (FIG. 1A) precursor the $Ru(EtCp)_2$ (FIG. 1B) precursors.
Figure 1B:
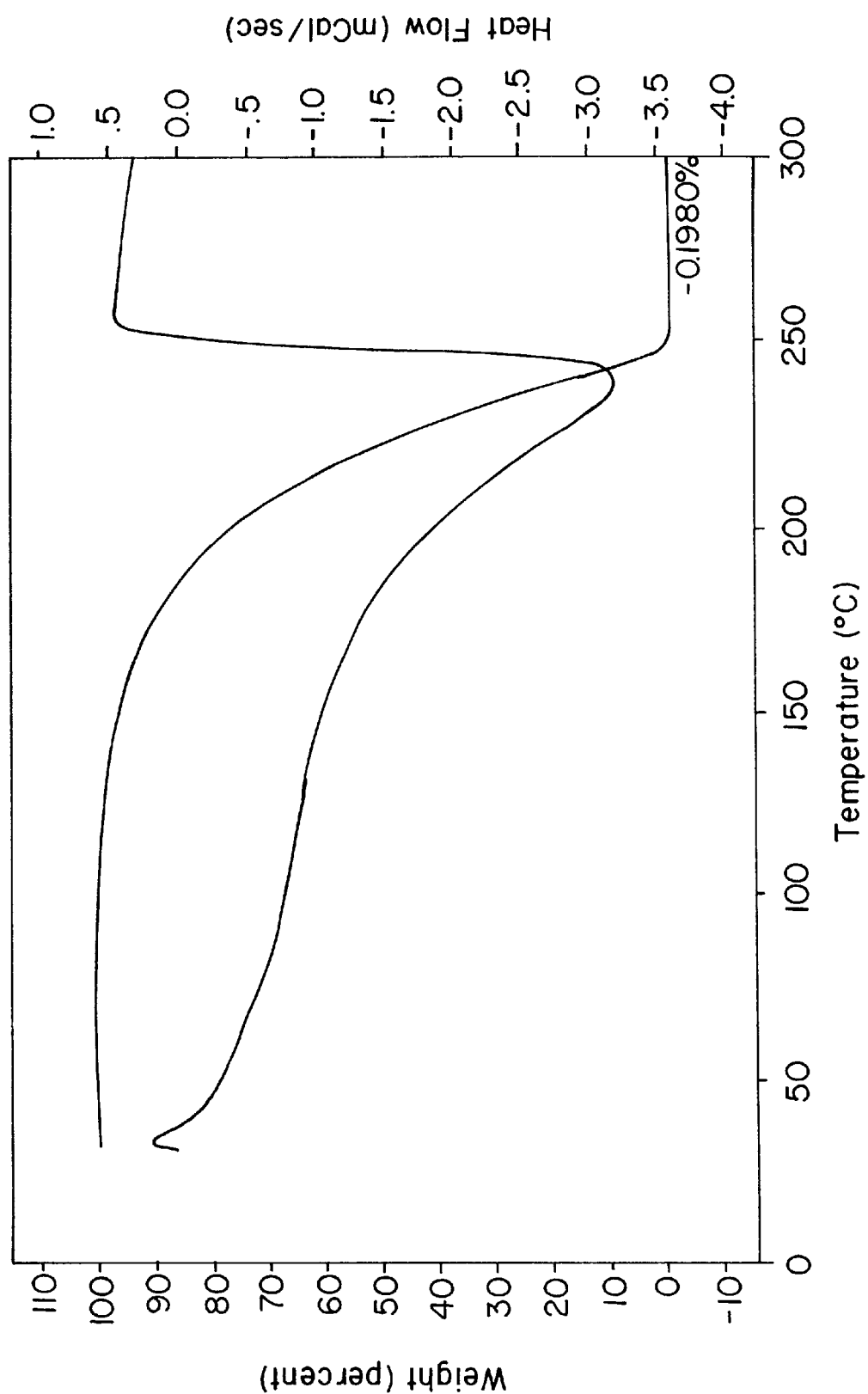

A combination of Thermal Gravimetric Analysis (TGA) and Differential Scanning Calorimetry (DSC) was used to evaluate the precursors $Ru(Cp)_2$ and $Ru(EtCp)_2$ (FIGS. 1A and 1B). These measurements are performed at atmospheric pressure. The thermal gravimetric analysis curve measures the sample mass as a function of temperature. A decrease in sample mass occurs during evaporation, sublimation, or decomposition. The mass of the involatile residue remaining after thermolysis indicates the amount of residue that is left after vaporization. When the precursor has no residue, the process has less potential for particles and process drifts. The $Ru(Cp)_2$ precursor has a residue of <3 wt % while $Ru(EtCp)_2$ has close to 0 wt % residue.

Differential Scanning Calorimetry (DSC) curve measures the relative amount of heat flow from the sample with respect to a reference material. The differential scanning calorimetry curve shows the temperatures at which endothermic and exothermic transitions take place. The endothermic behavior indicates sublimation, evaporation or melting while exothermic reactions indicate reactions or decomposition. Thus, from the differential scanning calorimetry curve, the temperature range at which decomposition and sublimation occur are estimated. The information from the curve provides a starting point at which to set the vaporizer temperature. $Ru(Cp)_2$ indicates an endothermic reaction (melting point) at 200° C. while a very broad endothermic peak is observed near 240° C. for $Ru(EtCp)_2$.

$Ru(EtCp)_2$ does not have limited solubility in solvents and can be used as a neat (pure) liquid or in a highly concentrated solution with a simple organic solvent, e.g., octane or tetrahydrofuran. As a result, the deposition rate is not limited as it is for the $Ru(Cp)_2$ precursor. Thermal gravimetric analysis data shows that $Ru(EtCp)_2$ leaves virtually no residue in the vaporizer or heated lines which could potentially lead to particles and process drift. Also, because $Ru(EtCp)_2$ is a liquid at room temperature, it is less likely to leave solid residues which can block precursor transport through the liquid lines.

EXAMPLE 4
Hardware and Process Conditions

Figure 2:
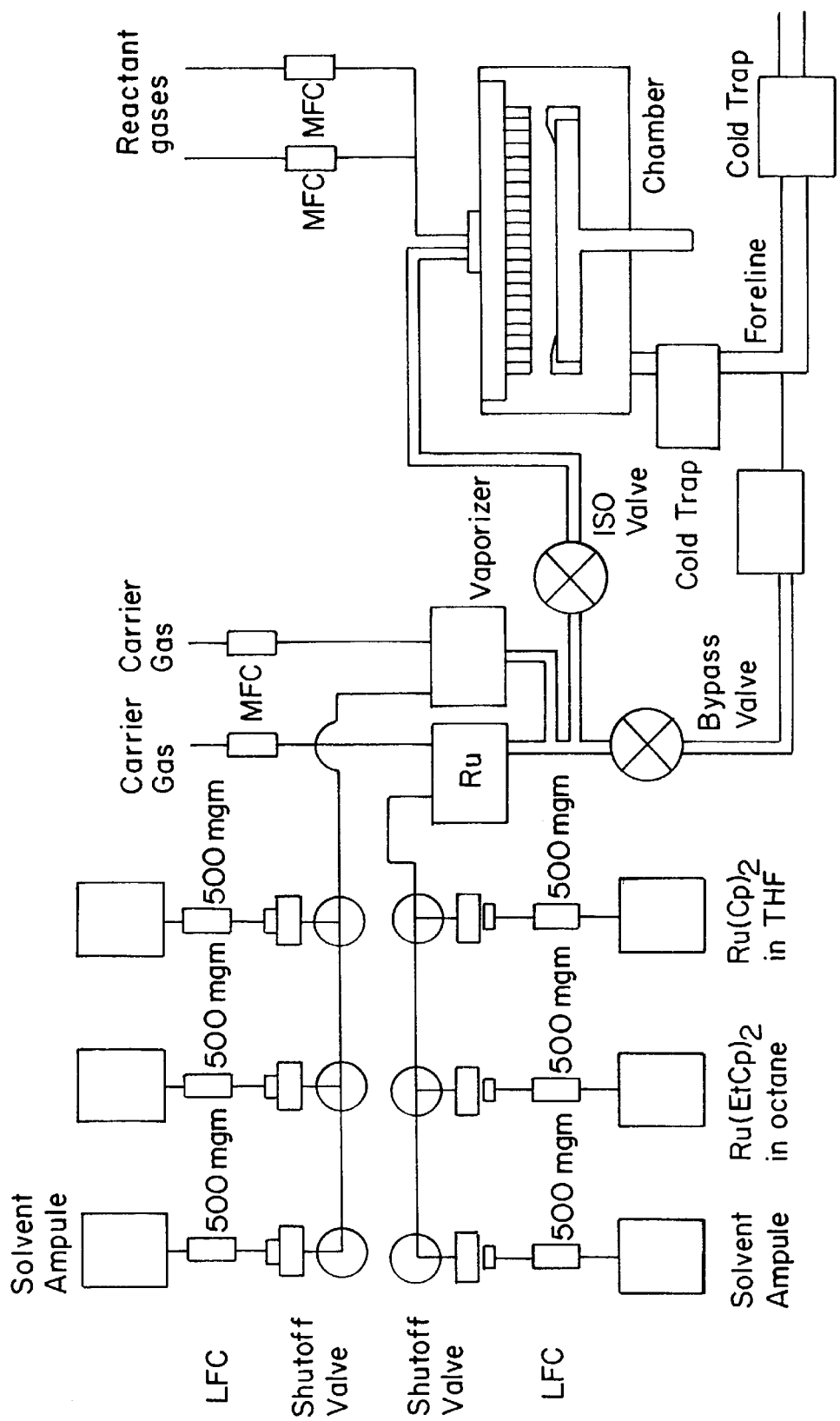
FIG. 2 depicts a schematic of an MLDS dual-vaporizer Ru chamber used for the chemical vapor deposition of ruthenium films. Chemical vapor deposition ruthenium deposition only uses one vaporizer.

All data was collected on an Applied Materials Ru chamber with the following configuration (FIG. 2):

Chamber: Ru

Faceplate: Standard

Heater: NGK HA-12 (95%)

Vaporizer: MLDS dual vaporizer (No precursor flow through $2^{nd}$ vaporizer)

Frit: Dual, 100 μm pore size

Tip: 10 mil tapered to 4 mil, 0.1" insertion length into top flit

Ampule Push Gas: 65 psi

The process conditions, unless specified otherwise, for $Ru(Cp)_2$ and $Ru(EtCp)_2$ comparisons were:

$Ru(Cp)_2$ (0.1 M in tetrahydrofuran)

Heater Temp. 330–350° C.; Vaporizer Temp. 220° C. Lid/Liner/Nose Temp. 190° C.; Ru Flow 300 mgm; O₂ flow 300 sccm; N₂-B Ru 450 sccm; N2-B Pt 250 sccm. (2nd vaporizer); ~Pressure 8 Torr; and D/R ~60 Å/min at 340° C. on PVD Ru seed $Ru(EtCp)_2$ (1 M in octane):

Heater Temp. 330–350° C.; Vaporizer Temp. 260° C.; Lid/Liner/Nose Temp. 260° C.; Ru flow 180 mgm; O₂ flow 300 sccm; N₂-B 450 sccm ($1^{st}$ vaporizer); N₂-B 250 sccm ($2^{nd}$ vaporizer); Pressure 8 Torr; and D/R ~100 Å/min at 330° C. on PVD Ru seed $Ru(EtCp)_2$(Pure):

Heater Temp. 330–350° C.; Vaporizer Temp. 260° C.; Lid/Liner/Nose Temp. 220° C.; Ru flow 50 mgm; O₂ flow 100 sccm; N₂ Flow 1300 sccm (to chamber); N₂-B 450 sccm (1 vaporizer only); Pressure 2 Torr; and D/R ~450 Å/min at 330° C. on PVD Ru seed

EXAMPLE 5

Vaporizor Temperature Optimization

Figure 3A:
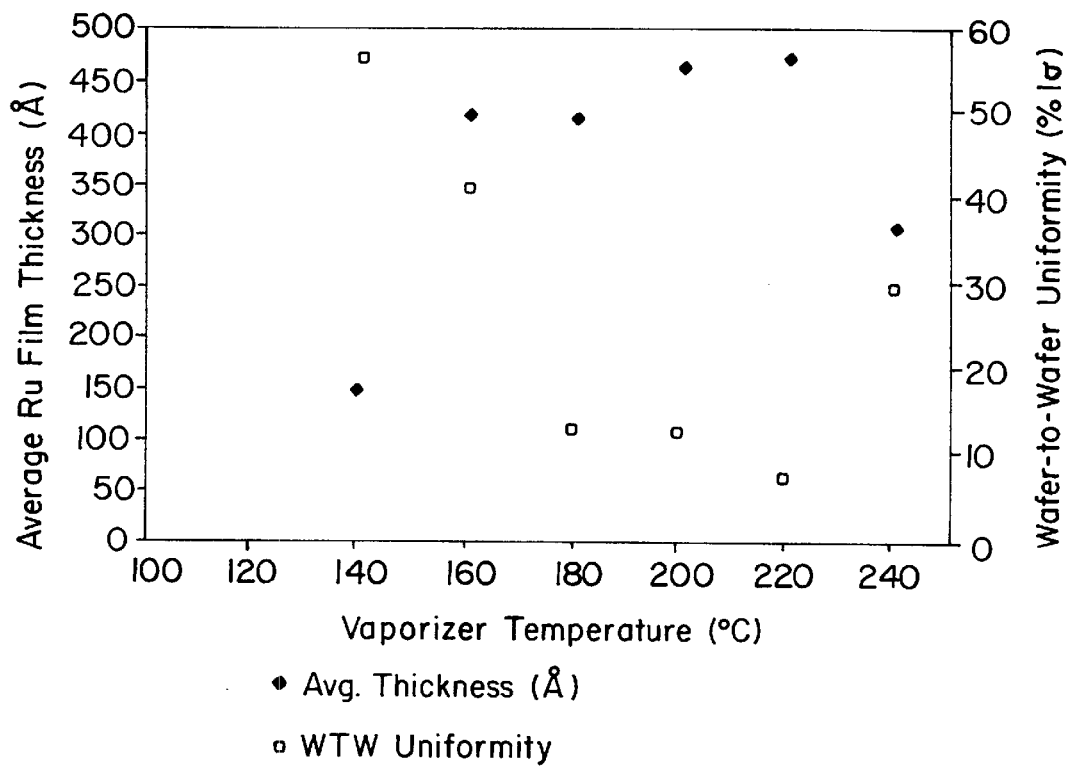
FIG. 3 depicts the Vaporizer Temperature Optimization Curve for the $Ru(Cp)_2$ (FIG. 3A) precursor the $Ru(EtCp)_2$ in octane (FIG. 3B) precursor.
Figure 3B:
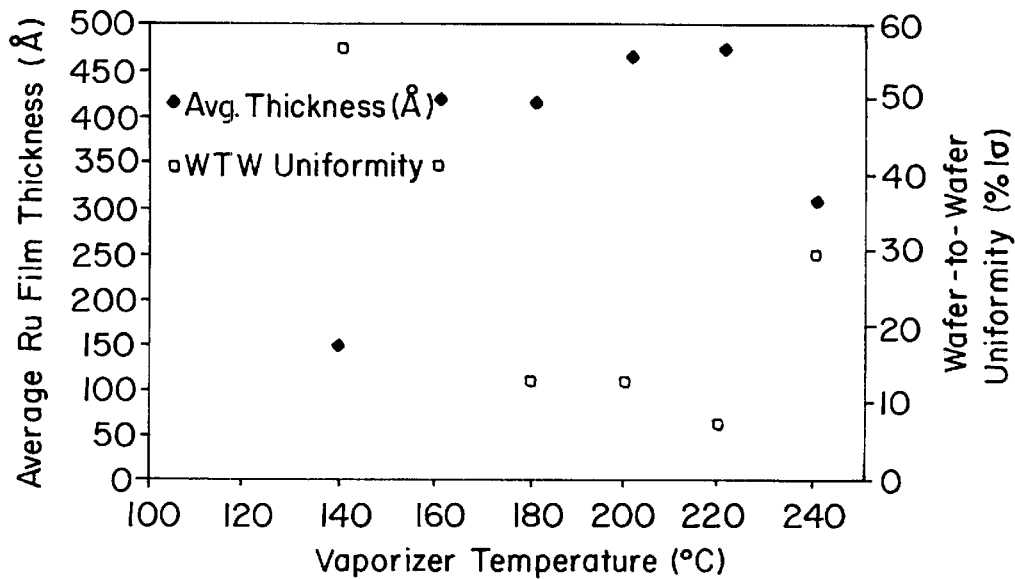

In order to evaluate the performance of $Ru(Cp)_2$ and $Ru(EtCp)_2$ on the Applied Materials Ru Captiva tool, vaporizer temperature optimization was performed. The Ru deposition rate was plotted against the vaporizer temperature (FIGS. 3A and 3B).

Based on these temperature optimization curves, a temperature of 220° C. for the vaporizer using $Ru(Cp)_2$ and 260° C. using $Ru(EtCp)_2$ was selected. These respective temperatures yield near the maximum deposition rate and good wafer-to-wafer repeatability for the respective precursors. The heated lines from the vaporizer to the chamber have the same temperatures. For $Ru(Cp)_2$, however, the lid, liner, and nose temperatures were lowered, to 190° C. as a precautionary measure due to observed reaction with $O_2$ in the showerhead area at a temperature of 250° C.

EXAMPLE 6

Kinetic study using $Ru(Cp)_2$ (0.1 M in tetrahydrofuran) and $Ru(EtCp)_2$ (1.0 M in octane)

The deposition temperature was varied for both $Ru(Cp)_2$ and $Ru(EtCp)_2$ precursors to determine the temperature dependence of the deposition rate using Arrhenius plots (log deposition rate vs. 1/T). Arrhenius plots are used to understand the reaction kinetics and to determine the temperature sensitivity of the CVD process. For good step coverage and conformality, the CVD process needs to be operated below the "knee" in the kinetic-limited regime. The "knee" is defined as the transition point between the mass-transfer limited regime and the kinetic-limited regime. Higher activation energies are generally not desirable for a stable metal organic (MOCVD) process due to high temperature sensitivity. The temperature dependence of the CVD Ru process for both $Ru(Cp)_2$ and $Ru(EtCp)_2$ precursors varies on different substrates thereby entailing an Arrhenius study on every substrate used.

The four substrates used for these Arrhenius studies are 2000 Å thermal oxide, 200 Å CVD TiN, 200 Å PVD TiN, and 60 Å PVD Ru seed layer. The CVD Ru process using either $Ru(Cp)_2$ or $Ru(EtCp)_2$ precursor is sensitive to substrate, so deposition rate and film properties vary on different substrates. Initially, thermal oxide substrates were used as substrates, but adhesion problems (peeling) and poor film quality and appearance were observed. For the CVD $Ru(Cp)_2$ process, CVD TiN and PVD TiN substrates improved the film adhesion and appearance. However, for CVD $Ru(EtCp)_2$, the haze and surface roughness were found to be very high on the TiN substrates. The use of a PVD Ru seed layer, approximately 60 Å thick, dramatically improved the haze of the CVD $Ru(EtCp)_2$ films.

Figure 4A:
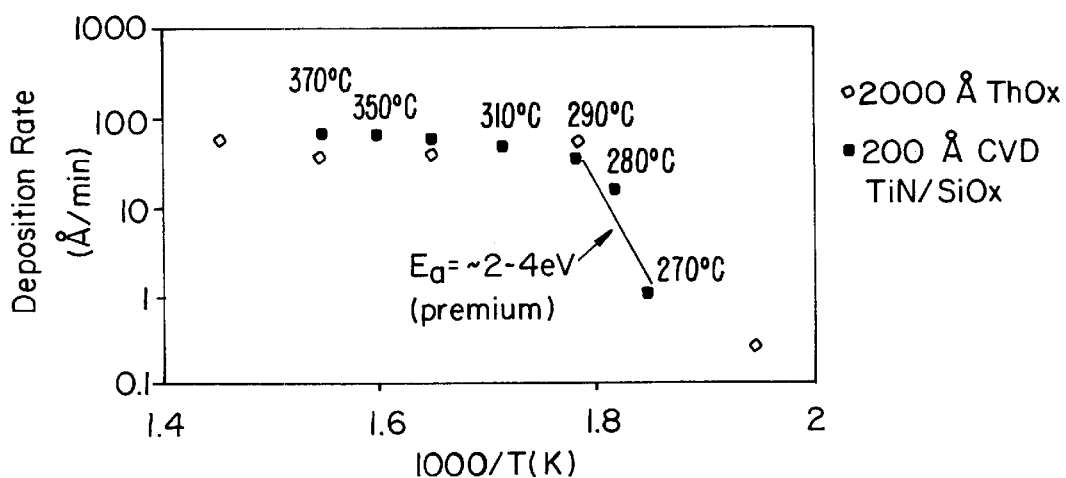
FIG. 4 depicts the Arrhenius plot of CVD Ru process using $Ru(Cp)_2$ precursor on 200 Å CVD TiN and on 2000 Å thermal oxide (FIG. 4A) and 60 Å PVD Ru seed layer (FIG. 4B) and using Ru(EtCp)$_2$ in octane on 200 Å PVD TiN (FIG. 4C) and 60 Å PVD Ru seed layer (FIG. 4D).

FIG. 4A shows the temperature dependence of the deposition rate for $Ru(Cp)_2$ deposited on PVD TiN and thermal oxide substrates. The CVD Ru process for this Arrhenius plot uses slightly different conditions (e.g. 2 Torr pressure, $O_2$ flow 500 sccm). The deposition rate dependence was similar on thermal oxide and CVD TiN. The activation energy is about 2–4 eV for $Ru(Cp)_2$ on TiN and thermal oxide substrates, and the "knee" was close to 300° C.

Figure 4B:
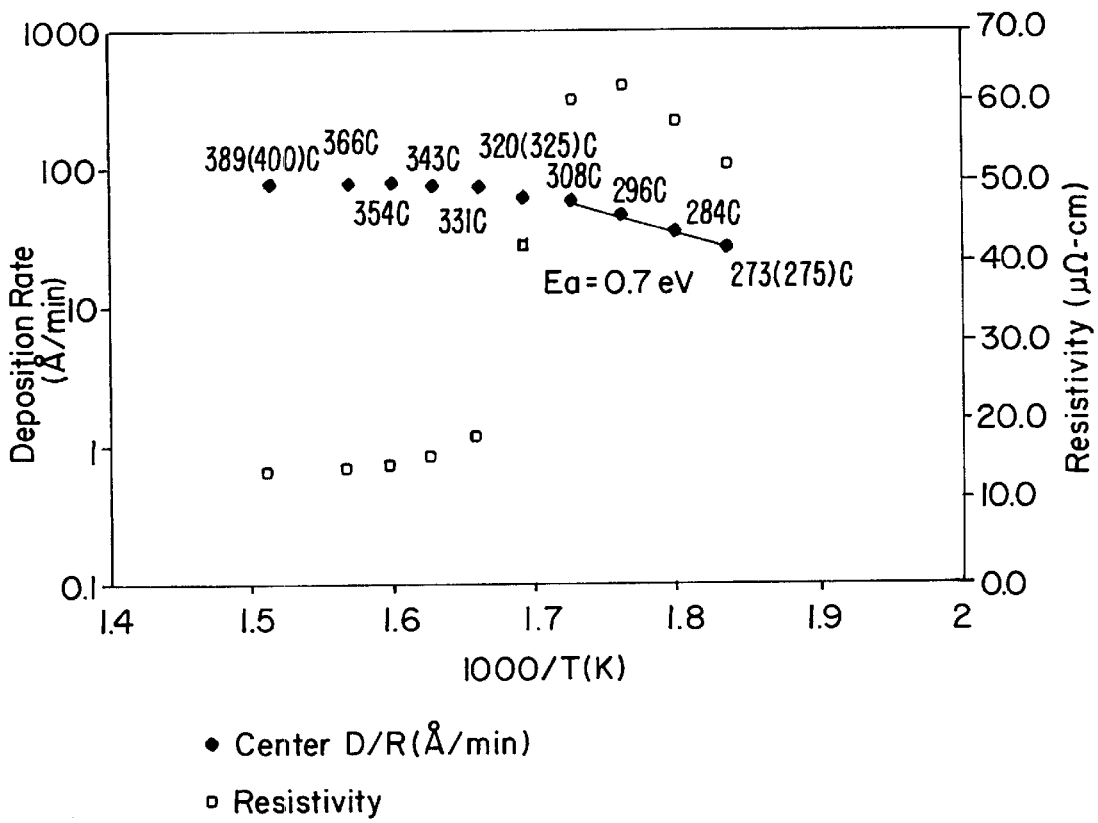

The Arrhenius plot of $Ru(Cp)_2$ on a PVD Ru seed layer is shown in FIG. 4B. The estimated activation energy of ~0.7 eV was approximately four times lower than the activation energy of $Ru(Cp)_2$ on TiN. A lower activation energy improves the process stability in the kinetic-limited regime. The temperature dependence of film resistivity is also plotted in FIG. 4B. The resistivity increases from about 20 $\mu\Omega$-cm to 60 $\mu\Omega$-cm when the temperature is reduced from 330° C. to 308° C. The sudden increase in resistivity is likely due to the formation of $RuO_2$ at the lower temperatures as indicated in XRD analysis. There appears to be a transition point around 320° C. in which $RuO_2$ is preferentially formed.

Figure 4C:
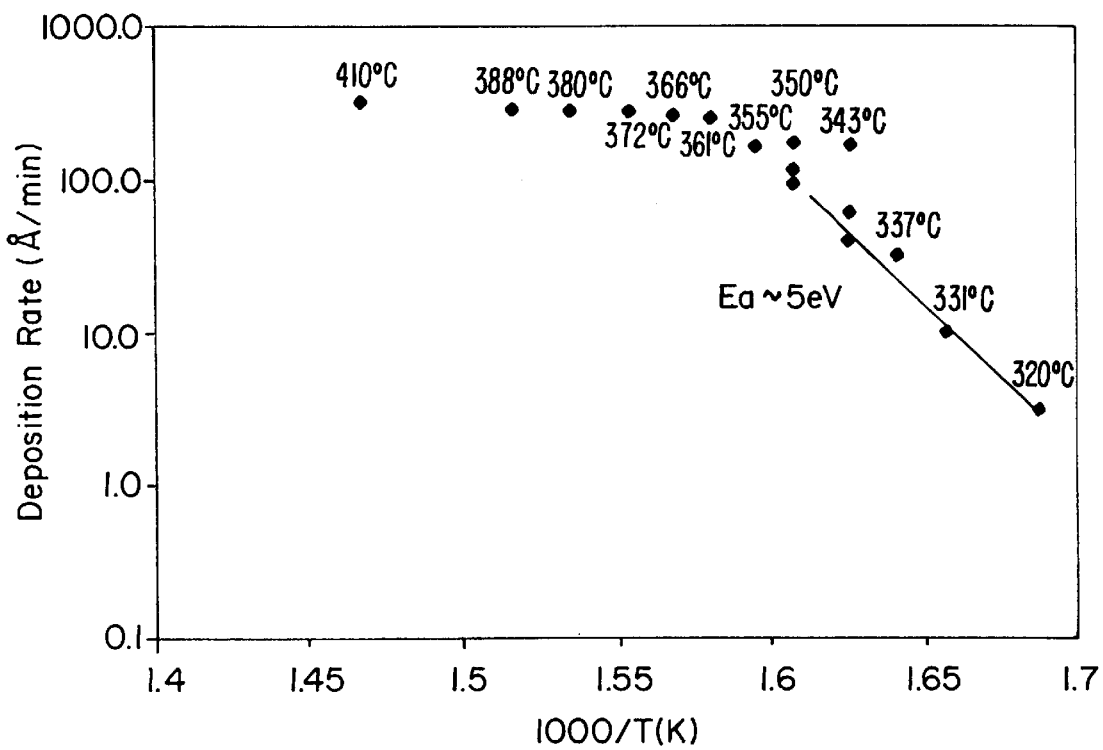

The Arrhenius plot of $Ru(EtCp)_2$ on PVD TiN shown in FIG. 4C has an activation energy of ~5 eV which is higher than $Ru(Cp)_2$. Also, the curve and "knee" are shifted to slightly higher temperatures than the $Ru(Cp)_2$ precursor. The higher activation energy is perhaps caused by the higher deposition rates achieved using the $Ru(EtCp)_2$ precursor.

Figure 4D:
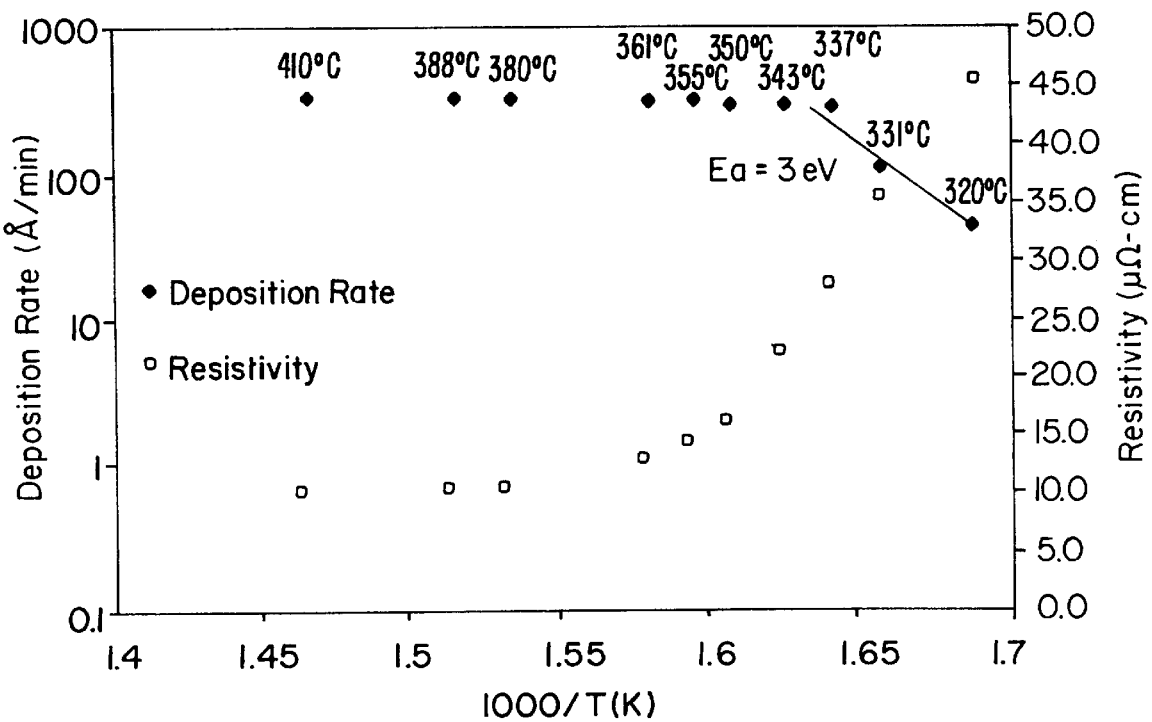

The Arrhenius plot and resistivity dependence for the $Ru(EtCp)_2$ precursor on PVD Ru seed substrates is shown in FIG. 4D. The curve was shifted to higher temperatures relative to the Arrhenius plot for $Ru(Cp)_2$ on PVD Ru seed substrates. The estimated activation energy for $Ru(EtCp)_2$ over the observed temperature range was about 3 eV, approximately four times higher than the activation energy for $Ru(Cp)_2$ on PVD Ru seed.

The resistivity increases gradually to 40 $\mu\Omega$-cm as the deposition temperature was lowered, in contrast to the abrupt increase in resistivity observed with the $Ru(Cp)_2$ precursor. In this case, the decrease in resisitvity may be caused by several factors: smaller grain size, decrease in film thickness, and some initial $RuO_2$ formation. However, $Ru(EtCp)_2$ appears to form less $RuO_2$ than $Ru(Cp)_2$ in the kinetic-limited regime.

The study of Arrhenius behavior of CVD $Ru(CP)_2$ and CVD $Ru(EtCp)_2$ shows both processes to be sensitive to substrate. For both $Ru(Cp)_2$ and $Ru(EtCp)_2$ precursors, the activation energy was lower when deposited on a PVD Ru seed layer rather than on other substrates such as TiN and oxide. In addition, the deposition rates on PVD Ru seed layers are higher than on TiN, BST, or TanOx (latter two results not shown) in the kinetic-limited regime. The lower activation energies and higher deposition rates on PVD Ru highlight the importance of using a PVD Ru seed layer as a substrate for CVD Ru growth.

The $Ru(EtCp)_2$ process has a higher activation energy and higher "knee" temperature than $Ru(Cp)_2$. However, at lower temperatures (T<320° C.), the wafers deposited with $Ru(Cp)_2$ form primarily the $RuO_2$ phase. Thus, below 320° C., the activation energy is mainly controlled by the formation of $RuO_2$ rather than ruthenium making it difficult to compare the activation energies for $Ru(EtCp)_2$ and $Ru(Cp)_2$.

The plots of resistivity temperature dependence show resistivity increasing as temperature decreases for both precursors. The increase in resistivity is more dramatic for $Ru(Cp)_2$. The higher resistivity for $Ru(Cp)_2$ is probably due to the formation of $RuO_2$, which has a higher bulk resistivity (45 $\mu\Omega$-cm) than pure Ru (7 $\mu\Omega$-cm).

EXAMPLE 7

Ruthenium Film Properties

The CVD Ruthenium film properties and process performance are summarized below in Table 3.

TABLE 3

Comparison of CVD Ru film properties and process performance with RU(Cp)$_2$ in tetrahydrofuran and Ru(EtCp)$_2$ in octane at different process temperatures on different substrates.

| Process | D/R Å/min | WTW thk % 1σ | WIW thk % 1σ | ρ μΩ-cm | ρ WIW % 1σ 5 mm | XRD Int. Ord. | Haze (ppm)/ Roughness (Å RMS, Rmax) | Step Cov/ Conf. % | Data Ref. |
|---|---|---|---|---|---|---|---|---|---|
| Ru(Cp)$_2$ 340° C. on TiN/ThOx | 70 | 1.8% | 2–6% by Meta pulse | 20 | 31% | | 97 ppm/ 31.4 Å 305 Å (470 Å film) | S/T: 40 B/T: 30 C: 60 | 100- water run Ru 91108 |
| Ru(Cp)$_2$ 340° C. on PVD Ru/ TiN/ Si | 70 | N/A | N/A | 15 | 5% | 002 101 100 | 112 ppm/ 62.2 Å 491 Å (710 Å film) | S/T: 30 B/T: 35 C: 60 | Q 9K1144 2 |
| Ru(Cp)$_2$ 320° C. on TiN | 50 | 10.2% | N/A | N/A | | | | S/T: 90 B/T: 90 C: 80 | Ru 91029 |
| Ru(Cp)$_2$ 320° C. on PVD Ru/ TiN/ Si | 60 | N/A | N/A | 38 | 20% | 101 002 100 | 230 ppm/ 59.0 Å 492 Å 588 Å film | | Q 9K1143 8 |
| Ru(EtCp)$_2$ 350° C. on TiN | 160 | N/A | N/A | 35 | 60% | | 730 ppm/ 122 Å 954 Å 1430 Å film | | 91103 5 |
| Ru(EtCp)$_2$ 330° C. on TiN | 10 | N/A | N/A | N/A | N/A | N/A | N/A | | N/A |
| Ru(EtCp)$_2$ 330° C. on PVD Ru | 120 | 1.2% | TBD | 42 | 8% | 100 002 101 | 39 ppm/ 663 Å 541 Å (700 Å film) | S/T: 90 B/T: 90 C: 80 | 25- wafer run 91119 |

Abbreviations:
S/T is sidewall thickness divided by top thickness.
B/T is bottom thickness divided by top thickness.
C is conformality which is defined as the thinnest part of the test structure sidewall divided by the thickest part of the sidewall

EXAMPLE 8
Kinetic Study Using Pure Ru(EtCp)$_2$

Using a pure Ru(EtCp)$_2$ precursor lowers the activation energy to 0.8–0.9 eV. Activation energy is also dependent on the rate of Ru flow. Using a CVD Arrhenius plot, comparing the Ru flow rates of 20, 50 and 80 mgm with concomitant O$_2$ flows of 40, 160 and 100 sccm and a constant N$_2$ flow on deposition rates on a 50 Å PVD Ru/2 kÅ ThOx substrate indicates that best conditions occur at Ru flow 50 mgm with an activation energy of 0.79 eV (FIG. 5). The higher activation energies at low temperatures for high Ru flow may possibly be due to a lack of N$_2$ flow. At an Ru flow rate of 50 mgm, uniformity increases rapidly as the temperature decreases to the optimal 335° C. Under these conditions Ru CVD yields a silver Ru film with a resistivity of 22 μΩ-cm (FIG. 6A). At an Ru flow of 20 mgm on the same substrate, uniformity increases dramatically below 345° C., a result of increased temperature sensitivity, and resistivity remains fairly constant at temperatures below 335° C., (FIG. 6B); under these process conditions the heater has a 4° C. max.-min. variation for setpoints from 300–350° C.).

Increasing the N$_2$ flow increases the deposition rate of Ru films on a 50 Å PVD Ru/2 kÅ ThOx substrate and lowers the activation energy in the kinetic-limited regime (FIG. 7), whereas a higher N$_2$ flow reduces the deposition rate in the mass transport regime. Additionally, at high N$_2$ flow, 1300 sccm, and 50 mgm Ru flow on the same substrate, resistivity increases at lower deposition temperatures (FIG. 8). Generally, increasing the N$_2$ flow rate improves the Ru CVD process, making it more stable and less temperature dependent. It is therefore possible to tune the nitrogen and oxygen flow rates and deposition temperature to achieve the desired Ru film.

EXAMPLE 9
X-Ray Diffraction Data of RU(Cp)$_2$ (0.1 M in tetrahydrofuran) and Ru(EtCp)$_2$ (1.0 M in octane)

Figure 9A:
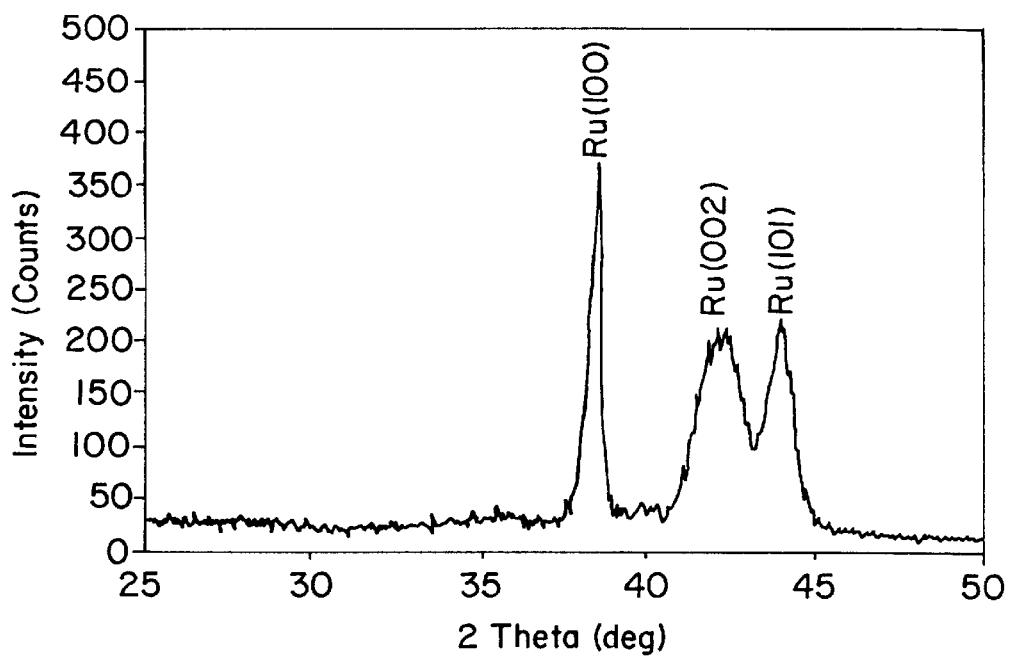
Figure 9B:
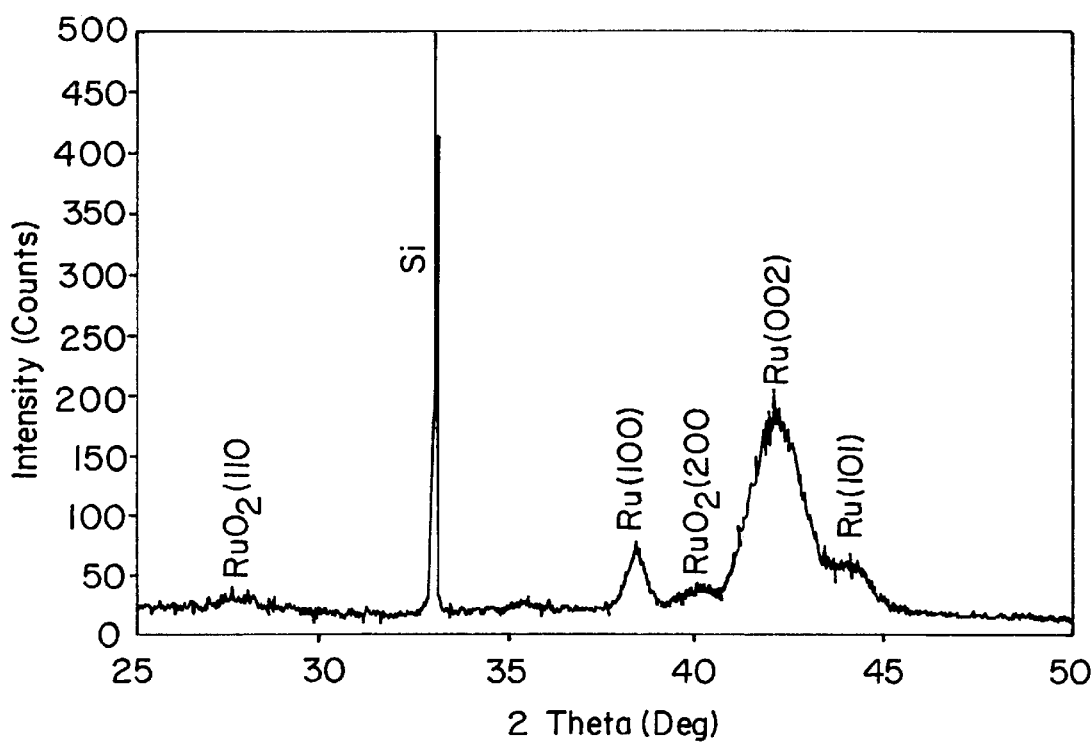

FIG. 9A shows an X-Ray diffraction plot of films grown with Ru(EtCp)$_2$ precursor in octane with a deposition temperature of 330° C., in the kinetic-limited regime. This film has a relatively strong Ru(100) orientation as well as Ru(002) and Ru(101) peaks. Although no peaks for RuO$_2$ were present, the resistivity of this film is greater than 30 μΩ-cm and RBS analysis shows that the film has 30±10% oxygen. This film was shiny and metallic in appearance. At 320° C., the X-Ray diffraction pattern (FIG. 9B) shows some evidence of RuO$_2$ formation with weak RuO$_2$(110) and RuO$_2$(002) peaks, but the dominant phase was Ru.

Figure 9C:
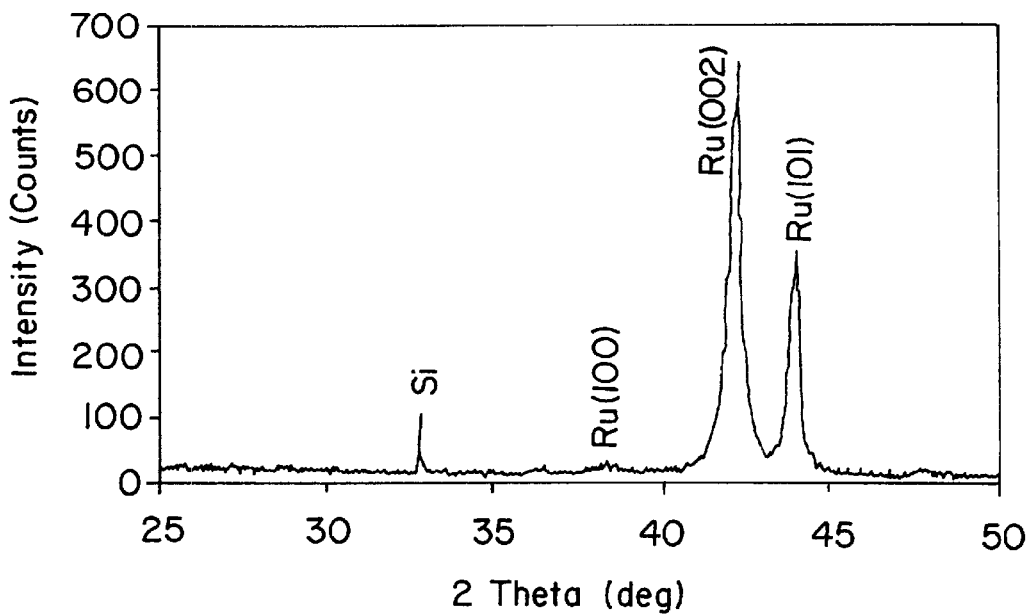
Figure 9D:
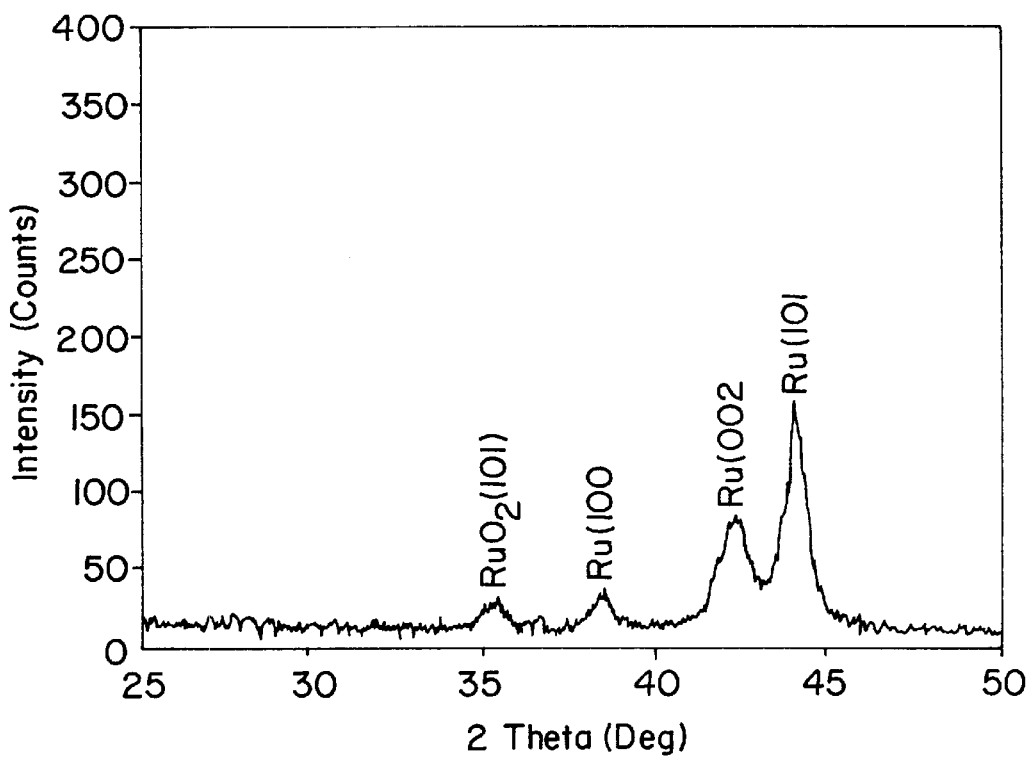
Figure 9E:
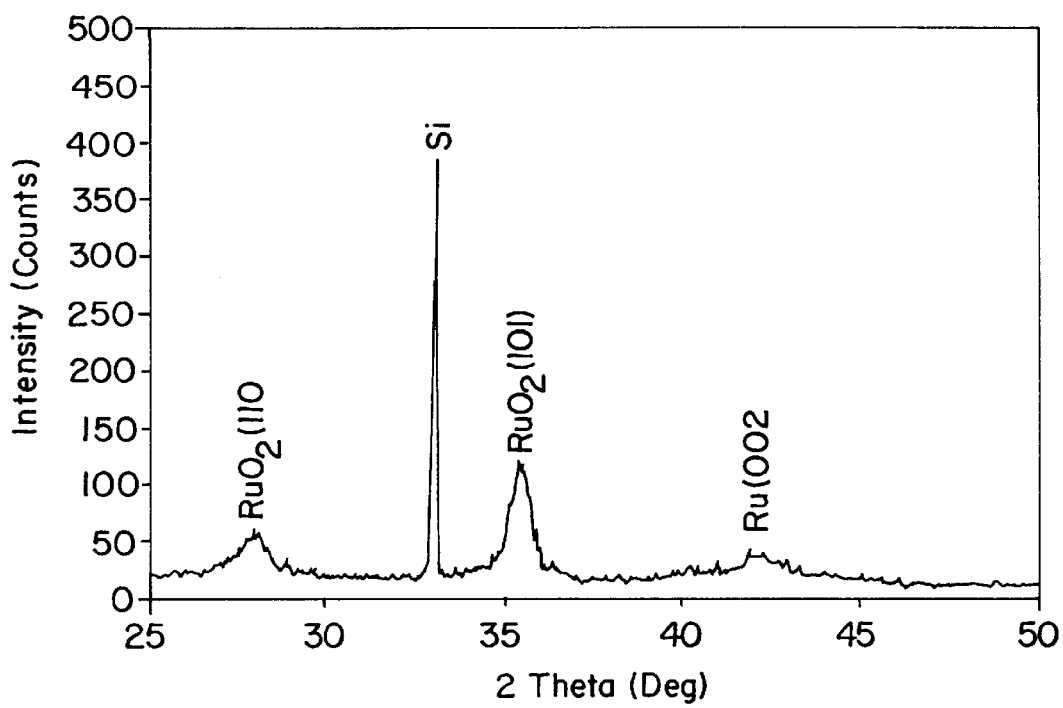

CVD Ru films grown with the Ru(Cp)$_2$ precursor in tetrahydrofuran have different crystalline orientation than films grown with Ru(EtCp)$_2$. FIG. 9C shows an X-Ray Diffraction pattern of CVD Ru grown with Ru(Cp)$_2$ at 340° C., in the mass-transfer limited regime. This film has a relatively strong Ru(002) peak as well as Ru(101) and Ru(100) peaks. At 320° C., some RuO$_2$ phase was mixed with the Ru phases (FIG. 9D). In the kinetic-limited regime at 295° C., the film was almost completely RuO$_2$ (FIG. 9E).

The extent of oxidation of the films grown with Ru(Cp)$_2$ in the kinetic-limited temperature regime appears to be greater than the oxidation of films grown with Ru(EtCp)$_2$. In fact, it has not been possible to grow films with mostly pure Ru phase at low temperatures using Ru(Cp)$_2$ using a wide range of gas flows and pressures. On the other hand, the O$_2$ flow can be varied using the, Ru(EtCp)$_2$ precursor to form mostly pure Ru phase or mostly RuO$_2$ phase. In this way the Ru(EtCp)$_2$ precursor has the advantage of tuning the film Ru/O composition ratio under low-temperature conditions where conformal films can be deposited.

The orientation of CVD Ru films depends on the substrate even when a PVD Ru, seed is used. FIG. 10 shows the X-Ray Diffraction patterns of CVD Ru using Ru(EtCp)$_2$ on two slightly different substrates each having a ~60 Å PVD Ru seed layer. One wafer had 2000 Å thermal oxide under the PVD Ru layer while the other had 200 Å PVD TiN. The CVD Ru film with the Ru seed on thermal oxide has a very strong Ru(101) peak while the film with Ru seed on TiN had only weak Ru peaks. This result emphasizes the significance of the substrate on the film properties even when a thin PVD Ru seed layer was used.

EXAMPLE 10
X-Ray Diffraction Data of Ru Films Grown with Pure Ru(EtCp)$_2$

As with the Ru(EtCp)$_2$ precursor in octane, pure Ru(EtCp)$_2$ precursor can be used to tune the Ru/O film composition ratio to control the crystalline orientation of the Ru films being deposited. The best Ru(002) orientation occurs at the lowest O$_2$ flow, FIG. 11 shows the effect of O$_2$ flow on CVD Ru orientation on a 50 Å PVD Ru/2 kÅ ThOx substrate at 355° C. RuO$_2$ formation begins to occur at O$_2$ flow 1200 sccm as evidenced by the abrupt appearance of RuO$_2$ (101) peaks and, to a lesser extent, RuO$_2$ peaks at 200 and 110.

An examination of the effect of O$_2$ flow on CVD Ru (002) orientation at 355° C. using process conditions of Ru 50 mgm, N$_2$ 250 sccm and 8 torr of pressure, again indicates an abrupt increase in the relative intensity of the 002 peak at O$_2$ flow 1200 sccm (FIG. 12). The concomitant increase in resistivity to greater than 30 $\mu\Omega$-cm suggests the appearance of RuO$_2$ in the deposited film. Below ~900 sccm O$_2$ flow, the film is silver and has a high Ru content which becomes a more brown/purple hue as the RuO$_2$ content increases with an increase in the O$_2$ flow rate.

EXAMPLE 11
Within-Wafer Film Thickness Uniformity

Measuring the within-wafer thickness uniformity of CVD Ru by XRF has been limited due to a background signal that varies from the center to the edge of the wafer. Uncorrected WIW thickness uniformity values by XRF ate typically 10–15% 1$\sigma$. The WIW thickness uniformity for blank substrates (which should measure zero thickness everywhere) is also very high. It is necessary to zero the background signal at all points on the wafer surface to ensure that reliable WIW measurements are made.

The Rudolph Metapulse is another tool that may be capable of measuring within-wafer Ru thickness. Initial data using the Ru(Cp)$_2$ precursor on TiN/Si substrates indicates the WIW thickness uniformity is as low as 2% 1$\sigma$. However, a discrepancy exists between the WIW thickness uniformity numbers and the XRF measurement. Possibly the Metapulse measurement is affected by poor adhesion between the CVD Ru and TiN layers. A second set of CVD Ru films grown on 60 Å. PVD Ru/2 kÅ SiO$_2$ yielded very weak signals. In this instance the oxide thickness could be reducing the film reflectivity. Metapulse measurements using SiO$_2$ substrates less than 1000 Å thick may correct the problem.

EXAMPLE 12
Within-Wafer Sheet Resistance Uniformity

Sheet resistance was measured by the KLA-Tencor 4-point probe analyzer. The within-wafer sheet resistance uniformity was taken from 49 points measured across the wafer using a 5 mm edge exclusion. A 5 mm edge exclusion was used to accommodate the PVD seed layer or adhesion layer which has a 3 mm edge exclusion from the clamp ring. The MRS requirement for WIW Rs uniformity (49pt) was 10% 1$\sigma$. The CVD Ru films using either precursor were able to achieve WIW Rs uniformity below 10% 1$\sigma$ using the PVD Ru seed layer. Table 3 above shows the dramatic improvement in Rs uniformity by using a PVD Ru seed layer. For Ru(Cp)$_2$, the Rs uniformity was reduced from 30% to 5% 1$\sigma$.

EXAMPLE 13
Dependence of Sheet Resistance on Film Thickness and Deposition Temperature The CVD Ru film resistivity ($\rho$) increases with decreasing deposition temperature. Typical $\rho$ vs T data is shown on the Arrhenius plots for the Ru(Cp)$_2$ (FIG. 4B) and Ru(EtCp)$_2$ (FIG. 4D) precursors. The trend was not linear but was instead sigmoidal; a sharp increase in film resistivity is seen near the transition from mass-transfer to kinetic-limited temperature regime. This increase in resistivity was most likely the result of increasing O incorporation in the Ru film with decreasing deposition temperatures. XRD patterns confirm the emergence of RuO$_2$ peaks at lower process temperatures. The extent of oxidation in the kinetic-limited temperature regime is greater for films grown with the Ru(Cp)$_2$ precursor relative to the Ru(EtCp)$_2$ in octane precursor, as evidenced by greater intensities of RuO$_2$ peaks and higher film resistivity (FIG. 9E).

EXAMPLE 14
Surface Roughness Comparison

The surface roughness and morphology of Ru films deposited by CVD varies depending on the wafer temperature and substrate. CVD Ru films were deposited on PVD TiN as well as on PVD Ru seed layers with PYD TiN. SEM images were taken of the ruthenium films to compare the surface morphologies. CVD Ru films deposited directly onto PVD TiN using Ru(EtCp)$_2$ in octane precursor had very rough surfaces (FIG. 13A). Using the same process conditions, the surface morphology was improved by using a thin PVD Ru seed layer, approximately 60 Å in thickness below the CVD Ru film (FIG. 13B). Both films were deposited using Ru(EtCp)$_2$ in octane precursor at a wafer temperature of 343° C.

With the Ru(Cp)$_2$ precursor, the surface roughness of the CVD Ru film was slightly better on PVD TiN than on the PVD Ru seed. FIG. 14 shows the AFM 2 $\mu$m×2 $\mu$m scans comparing CVD Ru on the PVD Ru seed with the PVD TiN substrate. Both films were deposited using the same 343° C. Ru(Cp)$_2$ process. Even though the RMS values cannot be directly compared because CVD Ru thickness was 50% greater for the sample on PVD Ru than the one on PVD TiN, the RMS roughness value was still 100% greater.

Comparing the surface morphology at 343° C. using a PVD Ru seed layer, the film deposited with Ru(Cp)$_2$ looks smoother than the films deposited with Ru(EtCp)$_2$ (FIGS. 13C and 13D). At a wafer temperature of 343° C., the process was mass-transfer limited for both precursors. In Table 4, AFM results show the roughness values to be fairly high for both films. The RMS value is 121.9 Å for a 1430 Å film deposited with the Ru(EtCp)$_2$ precursor and 62 Å for a 710 Å film deposited with the Ru(Cp)$_2$ precursor.

FIGS. 13E and 13F compare the two films at their respective temperatures in the kinetic-limited regime. At a wafer temperature of 320° C., the film deposited with Ru(Cp)$_2$ has raised and depressed regions which are detectable at lower magnifications, 2,000 to 10,000 times. This overlying macroscopic pattern causes visible haze on the wafer. FIG. 13F shows that the film deposited using Ru(EtCp)$_2$ at 331° C. had small grains with sharp, high aspect ratio features but no overlying pattern. The RMS value for a 540 Å film deposited with Ru(EtCp)$_2$ was 66 Å.

TABLE 4

AFM Roughness Values for CVD Ru Films

| Film Description | Thickness (Å) | RMS (Å) | Ra (Å) | Rmax (Å) |
| --- | --- | --- | --- | --- |
| 1. Ru(EtCp)$_2$ on PVD Ru seed at 331° C. | 540 Å | 66.3 Å | 51.4 Å | 540.6 Å |
| 2. Ru(EtCp)$_2$ on PVD Ru seed at 343° C. | 1430 Å | 121.9 Å | 97.5 Å | 954.4 Å |
| 3. Ru(Cp)$_2$ on PYD Ru seed at 320° C. | 588 Å | 59.0 Å | 46.9 Å | 491.5 Å |
| 4. Ru(Cp)$_2$ on PVD Ru seed at 343° C. | 710 Å | 62.0 Å | 49.7 Å | 490.8 Å |
| 5. Ru(Cp)$_2$ on PVD TiN at 343° C. | 470 Å | 31.4 Å | 24.9 Å | 305.0 Å |

Overall, the CVI) Ru films deposited using either Ru(EtCp)$_2$ or Ru(Cp)$_2$ as precursor appear to be quite rough. The average roughness RMS values were about 10% of the total film thickness for each of the conditions. The surface roughness does not seem to change dramatically with temperature. However, surface morphology was affected by the wafer temperature and the grain size tends to increase with temperature. For Ru(EtCp)$_2$ precursor, the surface roughness improves by using a PVD Ru seed layer relative to a PVD TiN layer. The opposite trend was observed for the Ru(Cp)$_2$ precursor.

Although surface roughness is an important consideration with the CVD Ru films, the actual roughness requirement has not been defined. It is not clear which precursor, Ru(EtCp)$_2$ or Ru(Cp)$_2$, produces smoother films. The substrate seems to be a strong variable that affects surface roughness and morphology. Additionally, process parameters such as pressure, carrier gas flow, and spacing, also can affect surface roughness.

EXAMPLE 15

Step Coverage

Ru(Cp)$_2$ and Ru(EtCp)$_2$ in octane precursor performance for step coverage and conformality were compared (FIGS. 15–20). The comparisons include a) deposition temperature, b) type of Ru precursor, and c) substrate (PVD Ru seed layer vs. TiN). Conformality is defined as the thinnest part of the test structure sidewall divided by the thickest part of the sidewall. Step coverage refers to sidewall (sidewall thickness/top thickness) and bottom coverage (bottom thickness/top thickness). Average thicknesses were used for the step coverage calculation.

For CVD processes, lower temperatures in the kinetic-limited regime were typically required to achieve good step coverage and conformality. FIG. 15 shows films deposited on PVD TiN using Ru(Cp)$_2$ at two different wafer temperatures, 343° C. (FIG. 15A) and 320° C. (FIG. 15B). At 343° C. the step coverage for a 0.17 µm structure with AR 5:1 is ~40% on the sidewall and ~30% on the bottom while the conformality is ~60%. The SEM cross-section images show better step coverage for the film deposited at 320° C., below the "knee" in the kinetic-limited regime. Step coverage (sidewall and bottom) for the 320° C. process is ~90%, and conformality is ~80% for a 0.17 µm structure at an aspect ratio (AR) of 5:1. However, an SEM of a structure with larger geometry (0.28 µm AR 3:1) reveals that the film is very rough and not continuous in some areas.

FIG. 16 compares the step coverage of Ru(Cp)$_2$ (FIG. 16A) and Ru(EtCp)$_2$ in octane (FIG. 16B) films at 343° C. on PVD TiN substrates. The SEM images reveal that the Ru(EtCp)$_2$ in octane film at 340° C. is extremely rough with faceted and discontinuous grains.

By depositing CVD Ru onto a PVD Ru seed layer, the film roughness and step coverage can be greatly reduced. FIG. 17 compares CVD Ru films with (FIG. 17B) and without (FIG. 17A) a PVD Ru seed layer using Ru(EtCp)$_2$ in octane. Because the CVD Ru process is slightly substrate dependent, the film without the PVD Ru seed layer is deposited at 340° C.; however, the two films are deposited in similar temperature regimes. The conformality and step coverage were much better with the PVD Ru seed layer, and the surface was smoother. The PVD Ru seed layer is a good template substrate for CVD Ru growth on patterned structures.

FIG. 18 shows SEM crosssections of CVD Ru films deposited onto ~60 Å PVD Ru seed layers. The film deposited using the Ru(EtCp)$_2$ in octane (FIG. 18B) precursor demonstrates much better step coverage with ~90% sidewall and bottom coverage for a feature size, of 0.15 µm and AR 6:1. The Ru(Cp)$_2$ (FIG. 18A) film only showed 50% sidewall coverage and 40% bottom coverage for the same structure. Both films have about 80% conformality that is higher than the films deposited without the PVD seed layer.

FIG. 19 shows an SEM crosssection of a CVD Ru film using pure Ru(EtCp)$_2$ on a 50 Å PYD,Ru/2 k Å substrate at 355° C. for a feature size of 0.15 1 µm and AR 6:1. Rs film uniformity is ~8% under these conditions. Top film thickness is 400 Å and side film thickness is 350 Å with both sidewall and bottom coverage at ~88%.

FIG. 20 shows the step coverage and conformality of CVD Ru deposited directly on a Ta$_2$O$_5$/poly-Si substrate without a PVD Ru seed layer at 340° C. The CVD Ru can not be deposited at the best known process temperature of 330° C. used for PVD Ru seed layers. The step coverage and conformality were quite good considering the narrow spacing and severe aspect ratios. The CVD Ru surface was smooth, even in the absence of PVD Ru seed, Thus, CVD Ru can be used as a top electrode for TanOx MIM applications even for very high aspect ratios.

The SEM images in FIG. 21 indicate that CVD Ru films do not grow uniformly on CVD BST films. CVD Ru was deposited on 300 Å BST/PVD Pt on 0.2 µm wide cup structures with AR 1.5:1. As with the deposition on Ta$_2$O$_5$, the process temperature had to be increased to 340° C. From the SEM photos, it appears that the CVD Ru growth is not controlled well on the BST surface. Large crystallites of ruthenium are seen randomly spread across the wafer inside and outside of the cup structures. In some areas, the ruthenium seems to be depositing along the sidewalls but the film looks rough.

In summary, conformality and step coverage improve at lower temperatures, especially in the kinetic-limited temperature regime. Lower deposition temperatures also reduce surface roughness. Both Ru(Cp)$_2$ and Ru(EtCp)$_2$ produce CVD Ru films with good step coverage and conformality in the kinetic-limited temperature regime; however, the deposition rate is higher using Ru(EtCp)$_2$ in comparable temperature regimes resulting in greater wafer throughput.

Additionally, using a PVD Ru seed layer reduces surface roughness and appears to improve nucleation of CVD Ru films deposited with Ru(EtCp)$_2$.

EXAMPLE 16

Process Condition Repeatability

The wafer-to-wafer thickness for both the Ru(Cp)$_2$ (FIG. 22A) and Ru(EtCp)$_2$ (FIG. 22B) precursors meet the C&F goal of less than 2% 1 sigma. However, the run with Ru(EtCp)$_2$ has a process drift, with the average thickness increasing 10–15 Å over 25 wafers. As this is only a 25 wafer run, longer run is needed to determine whether this trend of increasing thickness is an anomaly.

EXAMPLE 17

Edge Exclusion Ring

Figure 23A:
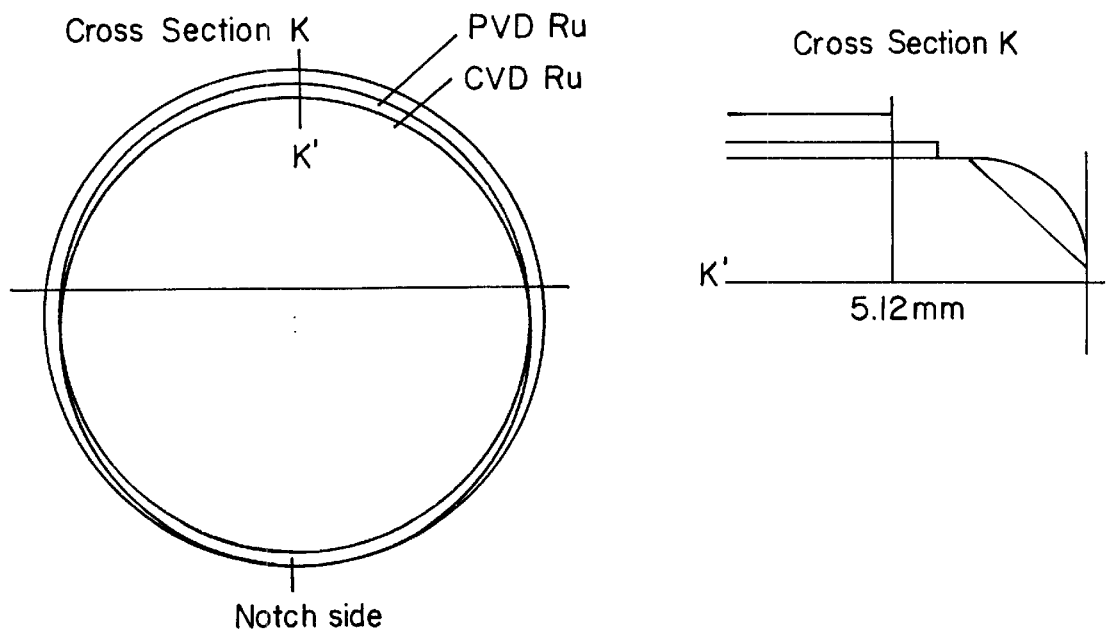
Figure 23B:
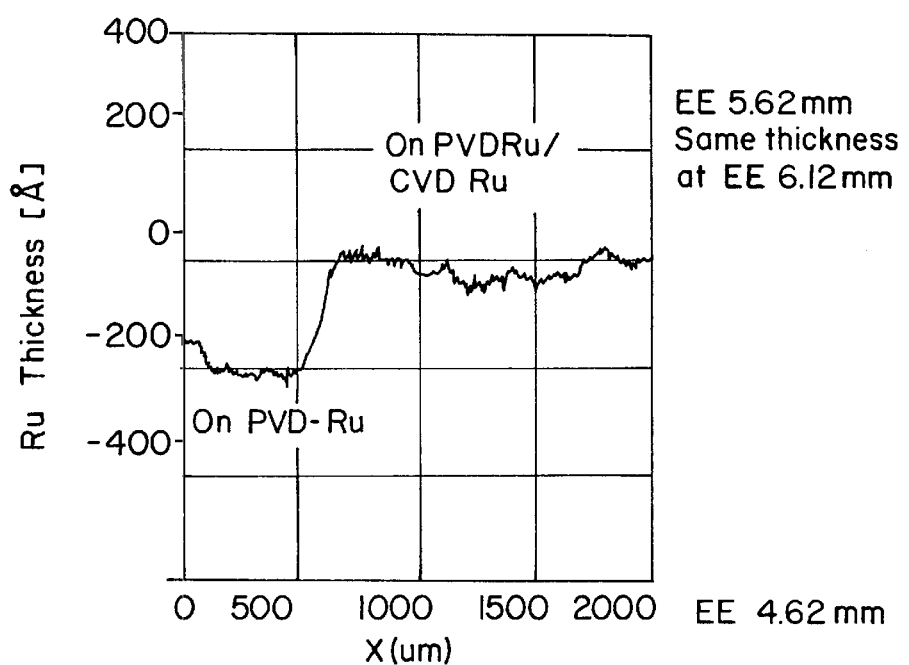
Figure 23C:
Figure 23C:
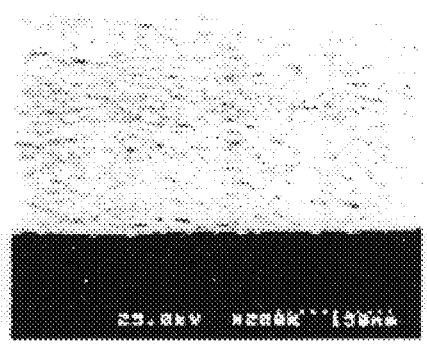
Figure 23D:
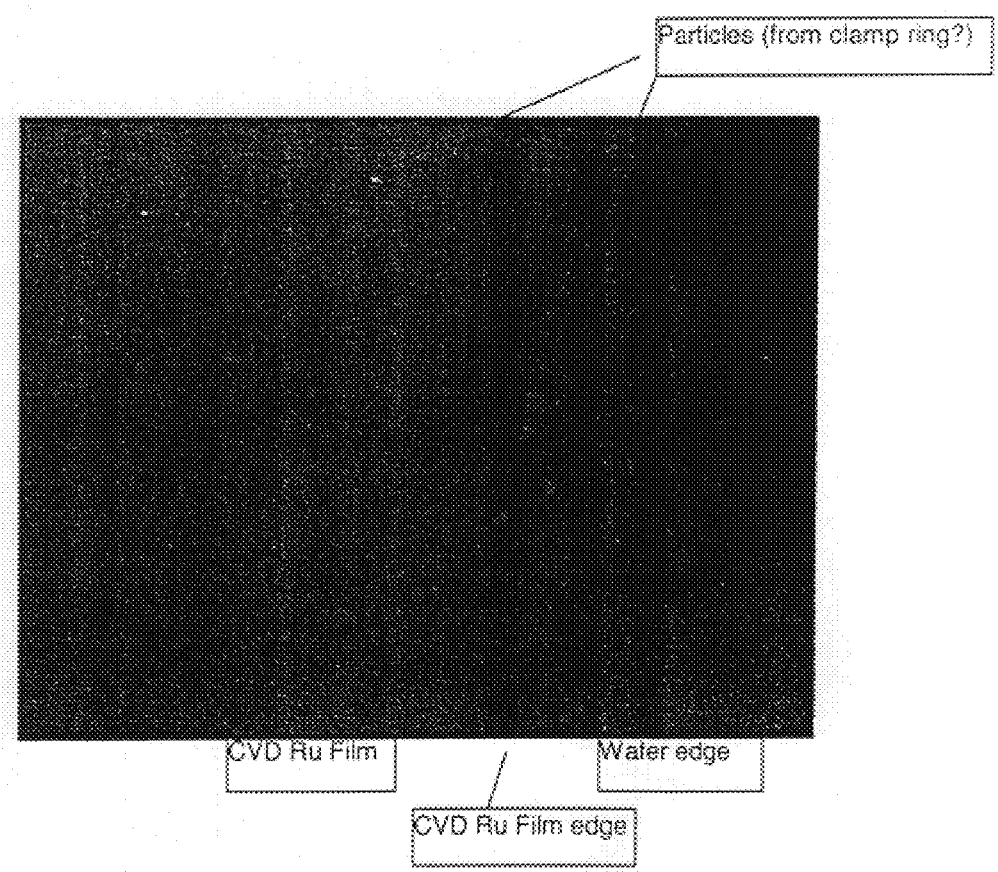

An aluminum clamp ring for edge exclusion of CVD Ru deposition was tested on a total of 8 wafers using the BKM CVD Ru process. Edge exclusion of CVD Ru is a common requirement and may be accomplished by means other than a clamp ring such as is well known by those having ordinary skill in this art. It is noted that the clamp ring was not centered on the wafer (FIG. 23A). This pattern was present for all 8 wafers. A centering mechanism would make the clamp ring concentric to the wafer. The film edge was reasonably well-defined at the top half of the wafer, suggesting a good contact to the wafer surface (FIG. 23B). The edge exclusion was primarily opposite the notch and extended approximately over the top half of the wafer only, as indicated by optical microscope observations of the film edge (FIG. 23C). On the very first wafer, particles were observed under the clamp ring at the top half of the wafer (FIG. 23D). The number of particles was reduced after several wafers were run.

The effects of the clamp ring on the CVD Ru process are identified below in TABLE 5. The clamp ring was allowed to touch the wafer for 60 seconds before the start of the deposition. Heater-showerhead spacing was 400 mil.

TABLE 5

| | Deposition Rate (Å/min) | WIW thk uniformity (%1 σ) 15 mm e.e. | Film (%1 σ) | Rs uniformity Resistivity (μΩ-cm) 5 mm e.e. | Avg Haze (ppm) |
|---|---|---|---|---|---|
| Without clamp ring | 123 Å/min | 15%* | 50 | 7% (5 m e.e.) | 30 |
| With Clamp ring | 118 Å/min | 13%* | 60 | 30% (5 mm e.e.) 13% (15 mm e.e.) | 30 | data taken with Ru(EtCp)$_2$ precursor at 330° C. using PVD Ru seed/TiN/Si substrates; data with clamp ring Ru9117; data without clamp ring Ru9124. *Note: high WIW uniformity due to varying background signal (wafer center to edge) in XRF. WIW uniformity is typically less than 5% 1_ from Metapulse (not measured on both sets of samples).

The biggest impact of the clamp ring was on the within-wafer Rs uniformity. The clamp ring may be affecting the wafer temperature near the edge and thus alter the film, The WIW thickness uniformity was similar; however, the current XRF measurement for WIW uniformity was not accurate. In addition, the deposition rate was slightly lower, and the film resistivity was slightly higher.

EXAMPLE 18

Metrology

One possible method of measuring CVD Ru thickness is using the sheet resistance measurement of the 4-point probe. FIG. 24 shows how sheet resistance varies with film thickness. If the film resistivity was assumed to be constant over this thickness range, then this is essentially a 1/thickness vs. thickness curve. With a proper calibration, the film thickness could be determined from the measured sheet resistance.

The within-wafer thickness uniformity of CVD Ru films was difficult to measure by XRF due to a large background signal from the silicon substrate that varies from wafer center to edge. While it may be possible to correct for this problem using proper calibration procedures, an alternative method is the Rudolph Metapulse tool, which measures laser-induced sound wave pulses in the film to obtain film thickness.

EXAMPLE 19

Ru(CP)$_2$ vs. Ru(EtCp)$_2$ precursors: Summary

The Ru(Cp)$_2$ precursor has a limited solubility (0.12M in THF) which limits the CVD deposition rate. The current deposition rate for the 343° C. process using Ru(Cp)$_2$ is about 70 Å/min in the mass-transfer-limited regime. In contrast, the Ru(EtCp)$_2$ precursor, which is a liquid at room temperature and is currently used at 1M in octane, has a current deposition rate of greater than 300 Å/min in the mass-transfer-limited regime and greater than 100 Å/min for the BKM process in the kinetic-limited regime.

The residue from the TGA curve is zero for Ru(EtCp)$_2$, while it is about 2% for Ru(Cp)$_2$. Finite residues are not desirable because residues can result in particles and/or process drift.

The step coverage using the Ru(EtCp)$_2$ precursor with a PVD Ru seed layer was close to 90% with the BKM process. The step coverage on TanOx substrates using Ru(EtCp)$_2$ for top electrode applications has excellent filling capabilities to greater than 10:1 AR.

The wafer-to-wafer thickness repeatability using Ru(EtCp)$_2$ meets the MRS alpha-exit requirements of less than 2% 1σ.

Compared with Ru(Cp)$_2$, Ru(EtCp)$_2$ has a wider process window for tuning the O/Ru film ratio. Ru(EtCp)$_2$ is less susceptible to oxidation during MOCVD Ru deposition at low temperatures. A low-oxygen Ru film with low film resistivity can be formed in the kinetic-limited temperature regime using certain process conditions. By changing process parameters, e.g., higher O$_2$ flow, it is also possible to form high-resistivity RuO$_2$ films with Ru(EtCp)$_2$. This is in contrast with Ru(Cp)$_2$ which has a greater tendency to form high-resistivity RuO$_2$ films in the kinetic-limited regime for nearly all process conditions. See Table 1 for a summary of CVD Ru film deposition using Ru(EtCp)$_2$ as the precursor as compared with Alpha Exit Specifications. Table 6 provides a summary of the processing parameter ranges for forming an Ru film using using Ru(EtCp)$_2$ as the precursor for metalorganic chemical vapor deposition (MOCVD) while Table 7 provides specific process parameters for optimal deposition of Ru films.

TABLE 6

Processing Parameter Ranges for Forming a Ru Film

| Process Parameter. | Range |
| --- | --- |
| Carrier Gas | Argon, Helium, Xenon, Neon; Krypton, Nitrogen |
| Carrier Gas Flow in Vaporizer for Ru Precursor | 100–1000 sccm (sccm = standard cubic centimeters per minute) |
| Push gas pressure | 20–200 psi |
| Oxygen Flow | 100–3000 sccm |
| Nitrogen Flow (to chamber) | 100–3000 sccm |
| Ru precursor | $Ru(Cp)_2$, $Ru(EtCp)_2$, $Ru(iPrCp)_2$, $Ru(MeCp)_2$, $Ru(thd)_3$, $Ru(OD)_3$ Me = methyl, iPr = isopropyl, Cp = cyclopentadienyl, Et = ethyl, thd = tetramethylheptanedionate, OD = octanedionate |
| Ru Concentration | 0.01 M - neat (pure) |
| Solvent (can be pure or mixtures of these) | 10. Alkanes (e.g., octane, heptane, decane, hexanes, etc.) 11. Aromatic hydrocarbons (benzene, toluene, xylenes, etc.) 12. Ethers (diethyl ether, dimethyl ether, etc.). 13. Cyclic ethers (tetrahydrofuran, tetrahydropyran, etc.) |
| Solvent additives | Stabilizers/complexing agents such as EDTA, ethlenediamine, pentamethyl-diethylenetriamine, etc. |
| Ru flow | 10–500 mg/min |
| Ru vaporizer temperature | 100–300° C. |
| Jackets/Lid temperature | 100–300° C. |
| Feedthrough temperature | 100–300° C. |
| Substrate support member temperature | 150–500° C. |
| Substrate Temperature | 100–500° C. |
| Showerhead/substrate support member spacing | 100–800 mils |
| Chamber pressure | 0.1–100 torr |

TABLE 7

Example Parameters for Forming a Ru Film

| Process Parameter | Range |
| --- | --- |
| Carrier Gas | Nitrogen |
| Carrier Gas Flow in Vaporizer for Ru Precursor | 450 sccm |
| Push gas pressure | 80 psi |
| Oxygen Flow | 300 sccm |
| Nitrogen Flow | 250 sccm (to chamber) |
| Ru precursor | $Ru(EtCp)_2$ |
| Ru Concentration | 1 M in octane (29% by weight) |
| Ru flow | 180 mg/mm |
| Ru vaporizer temperature | 260° C. |
| Jackets/Lid temperature | 260° C. |
| Feedthrough temperature | 260° C. |
| Substrate support member temperature | 345° C. |
| Substrate Temperature | 340° C. |
| Showerhead/substrate support member spacing | 350 mils |
| Chamber pressure | 8 torr |

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of depositing a ruthenium film on a substrate by liquid source chemical vapor deposition comprising the steps of:

selecting process conditions whereby said ruthenium film is deposited at a temperature in a kinetically limited temperature regime; and vapor-depositing a ruthenium film on the substrate using a liquid source chemical vapor deposition technique conducted at the selected process conditions.

2. The method of claim 1, wherein said liquid source is bis-(ethylcyclopentadienyl) ruthenium.

3. The method of claim 1, wherein said substrate is selected from the group consisting of thermal oxide, titanium nitride, titanium aluminum nitride, tantalum pentoxide, tantalum nitride, tantalum, barium strontium titanate, strontium ruthenate, silicon nitride, tungsten nitride, lead zirconium titanate, strontium bismuth tantalate, titanium silicide, and silicon dioxide.

4. The method of claim 3, wherein said substrate has a seed layer and wherein the vapor-depositing stepdeposits a ruthenium film on the seed layer.

5. The method of claim 4 wherein said-seed layer is formed by vapor deposition wherein said vapor deposition is selected from the group consisting of physical vapor deposition and chemical vapor deposition.

6. The method of claim 5 wherein said seed layer is selected from the group consisting of ruthenium, iridium, platinum, titanium nitride, titanium aluminum nitride, tantalum pentoxide, ruthenium oxide, iridium oxide, and titanium silicide.

7. The method of claim 1, wherein said process conditions comprise a ruthenium vaporization temperature of about 100 to about 300° C. and a substrate temperature of about 100 to about 500° C.

8. A method of depositing a ruthenium film on a substrate by liquid source chemical vapor deposition wherein said liquid source is bis-(ethylcyclopentadienyl) ruthenium comprising the steps of:

vaporizing said bis-(ethylcyclopentadienyl) ruthenium at a vaporization temperature of about 100° C. to about 300° C. to form a CVD source material gas;

providing an oxygen source gas; and forming a ruthenium film on a substrate in a reaction chamber using said CVD source material gas and said oxygen source reactant gas, wherein said substrate has a temperature of about 100° C. to about 500° C. and wherein deposition of said ruthenium film occurs in a kinetically limited temperature regime.

9. The method of claim 8, wherein said substrate is selected from the group consisting of thermal oxide, titanium nitride, titanium aluminum nitride, tantalum pentoxide, tantalum nitride, tantalum, barium strontium titanate, strontium ruthenate, silicon nitride, tungsten nitride, lead zirconium titanate, strontium bismuth tantalate, titanium silicide, and silicon dioxide.

10. The method of claim 9, wherein said substrate has a seed layer and wherein the forming step forms a ruthenium film on the seed ayer.

11. The method of claim 10 wherein said seed layer is formed by vapor deposition and said vapor deposition is selected from the group consisting of physical vapor deposition and chemical vapor deposition.

12. The method of claim 11 wherein said seed layer is selected from the group consisting of ruthenium, iridium, platinum, titanium nitride, titanium aluminum nitride, tantalum pentoxide, ruthenium oxide, and titanium silicide.

* * * * *